United States Patent
Obradovic et al.

(10) Patent No.: US 6,950,830 B2
(45) Date of Patent: Sep. 27, 2005

(54) STRESS-TEST INFORMATION DATABASE STRUCTURE AND METHOD OF USE

(75) Inventors: Mila Obradovic, Germantown, MD (US); Alisher Askarkhodjaev, Glen Burnie, MD (US)

(73) Assignee: Ciena Corporation, Linthicum, MD (US)

( * ) Notice: Subject to any disclaimer, the term of this patent is extended or adjusted under 35 U.S.C. 154(b) by 521 days.

(21) Appl. No.: 09/975,686

(22) Filed: Oct. 11, 2001

(65) Prior Publication Data

US 2002/0107581 A1 Aug. 8, 2002

Related U.S. Application Data

(60) Provisional application No. 60/240,596, filed on Oct. 13, 2000.

(51) Int. Cl.[7] .............................................. G06F 17/30
(52) U.S. Cl. .................................................. 707/104.1
(58) Field of Search ............................ 707/104.1, 100, 707/1, 103, 109, 110; 717/124; 700/108, 109, 110

(56) References Cited

U.S. PATENT DOCUMENTS

| | | | | |
|---|---|---|---|---|
| 5,295,222 A | * | 3/1994 | Wadhwa et al. | 717/104 |
| 5,504,879 A | * | 4/1996 | Eisenberg et al. | 707/100 |
| 5,539,652 A | * | 7/1996 | Tegethoff | 703/14 |
| 5,740,429 A | | 4/1998 | Wang et al. | 395/615 |
| 5,745,767 A | * | 4/1998 | Rosen et al. | 717/124 |
| 5,831,445 A | | 11/1998 | Atkins et al. | 324/760 |
| 5,966,021 A | | 10/1999 | Eliashberg et al. | 324/750 |
| 6,006,028 A | * | 12/1999 | Aharon et al. | 703/21 |
| 6,401,220 B1 | * | 6/2002 | Grey et al. | 714/33 |

FOREIGN PATENT DOCUMENTS

GB 2346463 9/1999

OTHER PUBLICATIONS

Fayn et al., Design and Implementation Strategies of a Core Database Model for the Storage and Retrieval of Serial ECG Data, IEEE, Computers in Cardiology, Sep. 25–28, 1994, pp. 189–192.*

* cited by examiner

Primary Examiner—Greta Robinson
(74) Attorney, Agent, or Firm—Michael R. Cammarata

(57) ABSTRACT

A database architecture and method of using a database is disclosed. The database is intended for use with a product stress testing system in which a large number of different modules may be subjected to a variety of stressors including environmental stressors and functional load testing. The database also enables a wide variety of test and communication equipment to be used in an efficient manner to test and communicate with the module being tested. Stress test results may be associated with the various products, the results may be mapped against product-specific test criteria and generic commands may be translated to product-specific commands.

24 Claims, 19 Drawing Sheets

STRESS-TEST INFORMATION DATABASE STRUCTURE AND METHOD OF USE

CROSS REFERENCE TO RELATED APPLICATIONS

This application claims the benefit of priority under 35 U.S.C. §119(e) to U.S. Provisional Application Ser. No. 60/240,596 filed on Oct. 13, 2000 the entirety of which is hereby incorporated by reference.

BACKGROUND OF THE INVENTION

1. Field of Invention

The invention relates to methods and systems for performing stress testing of equipment. The invention also relates to active and passive stress testing using modular design and robust data collection that is adaptable to a variety of equipment.

2. Description of Related Art

It is common to subject integrated circuits (IC) to various stresses to ensure reliability. Specifically, an IC is typically subjected to high temperatures for an extended period of time. This process is called "burn-in" testing in the art and identifies marginal devices likely to succumb to such stresses in the field.

Various systems and methods have been designed to perform burn-in testing of integrated circuits and computer components. Many of these conventional solutions focus on specific adapters and hardware that permit high-volume burn-in testing of specific equipment.

For example, Slocum (U.S. Pat. No. 6,097,201) discloses a system of stackable test boards in which a large number of integrated circuit boards may be mounted. Each of Slocum's test boards includes a contactor region that permits test signals to be routed to the individual integrated circuit boards. As such, Slocum's system is specifically designed to perform high-volume burn-in testing of specific components (integrated circuit boards).

Leung (U.S. Pat. No. 5,798,653) utilizes a special-purpose burn-in controller located within the burn-in oven to "exercise" an integrated circuit (IC) by toggling a high percentage of the switches within the IC.

Leung also illustrates the conventional thinking of burn-in testing which is to select a statistically significant sample of the product (IC's in this case) which are then subjected to burn-in testing. Like Slocum, Leung's system performs a dynamic test in which input stimuli are applied to the ICs to exercise or toggle the electrical circuit nodes of the IC.

Leung performs two types of dynamic burn-in testing on these sample IC's including an infant mortality burn-in and a longevity qualifying burn-in which mainly differ in the amount of time in which the IC's are subjected to the age-accelerating burn-in test. A simple data set is collected from these tests, which includes how many ICs succumb to infant mortality.

The flexibility of conventional stress testing systems is quite limited. Moreover, the number testing circuits matches the number of IC boards being tested thus requiring duplicative testing hardware. Moreover, the data collected by conventional system is quite rudimentary. Thus, there is a need in the art that solves these and other deficiencies in conventional stress-testing systems.

SUMMARY OF THE INVENTION

The present invention brings revolutionary concepts to the field of stress testing: utilizing a virtual oven, sharing test equipment, and logically grouping components and modules to be tested provides many distinct advantages over the prior art.

In general, the inventive systems and methods solve the problem of massive manual management of the following: a) process control, b) data, c) active signal controls, and d) product performance verification for stress testing. This goal was accomplished by designing, developing, and making operational an Automated Monitoring System (AMS). AMS communicates to modules and test equipment that are undergoing and performing stress testing as well as collecting the data automatically.

Stress testing according to one aspect of the invention includes exposing operating equipment/modules to thermal stress (or other stressor(s)) over a long (e.g. 48 hour) period of time including an (e.g. 24 hour) active test such as a bit error rate test (BERT) for optically tested modules (e.g. transmitters, receivers, remodulators, selectors, transceivers, variable optical attenuators, and amplifiers). The stress tests may also involve introducing noise to the test signal and/or degrading the test signal strength. The invention is capable of testing a wide variety of other components including electronic, opto-electronic, and optical components.

The inventive stress-testing process is a critical component of the manufacturing flow for producing reliable modules because the invention:

Reveals module damage due to handling (e.g. electrostatic discharge or other handling related damage).

Virtually simulates field conditions over a broad range of temperatures, operating conditions, and signal conditions.

Deliberately ages the product so as to eliminate substantially all early life failures from the product shipped to the customer.

More specifically, virtual oven for stress testing a plurality of modules includes a logical group of modules loaded into an environmental stress screening room wherein an environmental stress parameter of the environmental stress screening room changes over time; a test equipment operatively connected to the modules of said logical group, said test equipment generating a test signal and capable of performing an active test of at least one of the modules of said logical group at a time; and a controller operatively connected to said test equipment and to said logical group of modules; said controller receiving results of the active test performed by said test equipment.

The modules may also include sensors or other devices for measuring parameters of the module and the controller may receive passive test measurement values from these sensors. In this way, a passive test of the modules may be performed independently of and simultaneous with the active testing. The results of the active test and the passive test measurement values for each of the modules are associated with the module and stored in a database.

Furthermore, the controller may send a command to at least one module of the logical group to, for example, place that module in a desired operational state, exercise the module, or otherwise assist in the testing regime.

Moreover, a network may be used to operatively connect the test equipment with the controller, the memory device, and each of the modules of the logical group. The invention also includes a system of virtual ovens that may be connected via a network.

The inventive methods for stress-testing a plurality of modules includes designating a logical group of modules in an environmental stress screening room wherein an environmental stress parameter of the environmental stress screening room changes over time; generating a test signal; supplying the test signal to at least one of the modules of the logical group to subject the at least one module to an active test thereof; and receiving results of the active test from one of the modules of the logical group with a test equipment.

The method may perform a series of tests of the logical group modules on a time-share basis with the test equipment. In addition, the method may further include receiving passive test measurement values from at least one of the modules of the logical group; analyzing the passive test measurement values and the active test results; and displaying results of said analyzing step.

Moreover, the invention encompasses a method of asynchronously conducting stress testing on a plurality of groups modules including a first and second logical groups of modules. This method asynchronously initiates testing of the first and second logical groups of modules; tests the first logical group of modules with the first test equipment; and tests the second logical group of modules with the second test equipment, wherein each of said testing steps respectively includes said generating step, said supplying step, and said receiving step.

The inventive methods also include receiving passive test measurement values from at least one of the modules of the logical group; and storing results of the active test and the passive test measurement values for each of the modules in the database.

Moreover, the modules comprising the logical groupings are not necessarily physically adjacent to one another.

The inventive virtual oven system may also utilize an inventive database. In particular, the preferred database used by the virtual oven system invention is the inventive stress-test information database stored in a computer-readable medium and usable for storing information related to a stress-test of different products, comprising: a product data entity storing product-specific information for a plurality of the different products that may be subjected to the stress-test; a process data entity storing testing process information for conducting one or more stress-test processes of the stress-test; a result data entity storing stress-test result information relating to one or more results of the stress-test processes; a product-result map relating said product data entity to said result data entity; and a process-result map relating said process data entity to said result data entity.

The stress-test information database may further include, particularly when a plurality of equipment is utilized to conduct the stress-test, the following elements: a command data entity storing command information that may be utilized to command the equipment; and an equipment data entity storing information relating to the equipment; said equipment data entity being associated with said command data entity to permit a variety of equipment-specific command information to be retrieved.

The command data entity may include a generic command data entity storing information relating to generic commands usable to conduct the stress test processes and an equipment command string data entity usable for translating generic commands to equipment-specific commands, said generic command data entity being associated with said equipment command string data entity; and said equipment data entity being associated with said command data entity, wherein a generic command may be translated into an equipment-specific command via the associations between said generic command data entity, said equipment command string data entity, and said equipment data entity.

In addition, the stress-test database may further include: a parsing table storing information relating to parsing of equipment-specific data received as a result of the stress test; said parsing table being associated with said equipment data entity to permit the equipment-specific data to be parsed into a more consistent format suitable for storage by said result data entity.

If the database is used with the virtual oven invention discussed above, it is advantageous to further include a virtual oven data entity storing information relating to one or more virtual ovens that may be utilized to conduct the stress test. More particularly, the process data entity may include: a process information item storing information relating to stress test process identity and test process description; a process test run data entity storing information relating to stress test process identity, virtual oven identity and stress test process start/stop time(s); and a virtual oven data entity storing information relating to virtual oven identity, virtual oven description and virtual oven location, said process test run data entity relating said virtual oven data entity to said process information item in order to permit functional associations between virtual ovens, stress test processes, and process-test runs.

Moreover, the stress-test database may also include a test criteria data entity storing information relating to stress-test criteria, said test criteria data entity being associated with said result value data entity, said result value data entity item further including a pass/fail information item, said result value data entity and said test criteria data entity being usable to determine whether the product has passed or failed one or more of the stress-test processes.

In addition, an inventive method of storing information related to a stress-test of different products in a computer-readable stress-test information database is disclosed and includes: storing product-specific information for a plurality of the different products that may be subjected to the stress-test in a product data entity; storing testing process information for conducting one or more stress-test processes of the stress-test in a process data entity; storing stress-test result information relating to one or more results of the stress-test processes in a result data entity; relating the product data entity to the result data entity with a product-result map; and relating the process data entity to the result data entity with a process-result map.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF INVENTION

The following detailed description of the invention refers to the accompanying drawings. The same reference numbers in different drawings identify the same or similar elements. Also, the following detailed description does not limit the invention. Instead, the scope of the invention is defined by the appended claims and equivalents thereof.

Figure 1A:
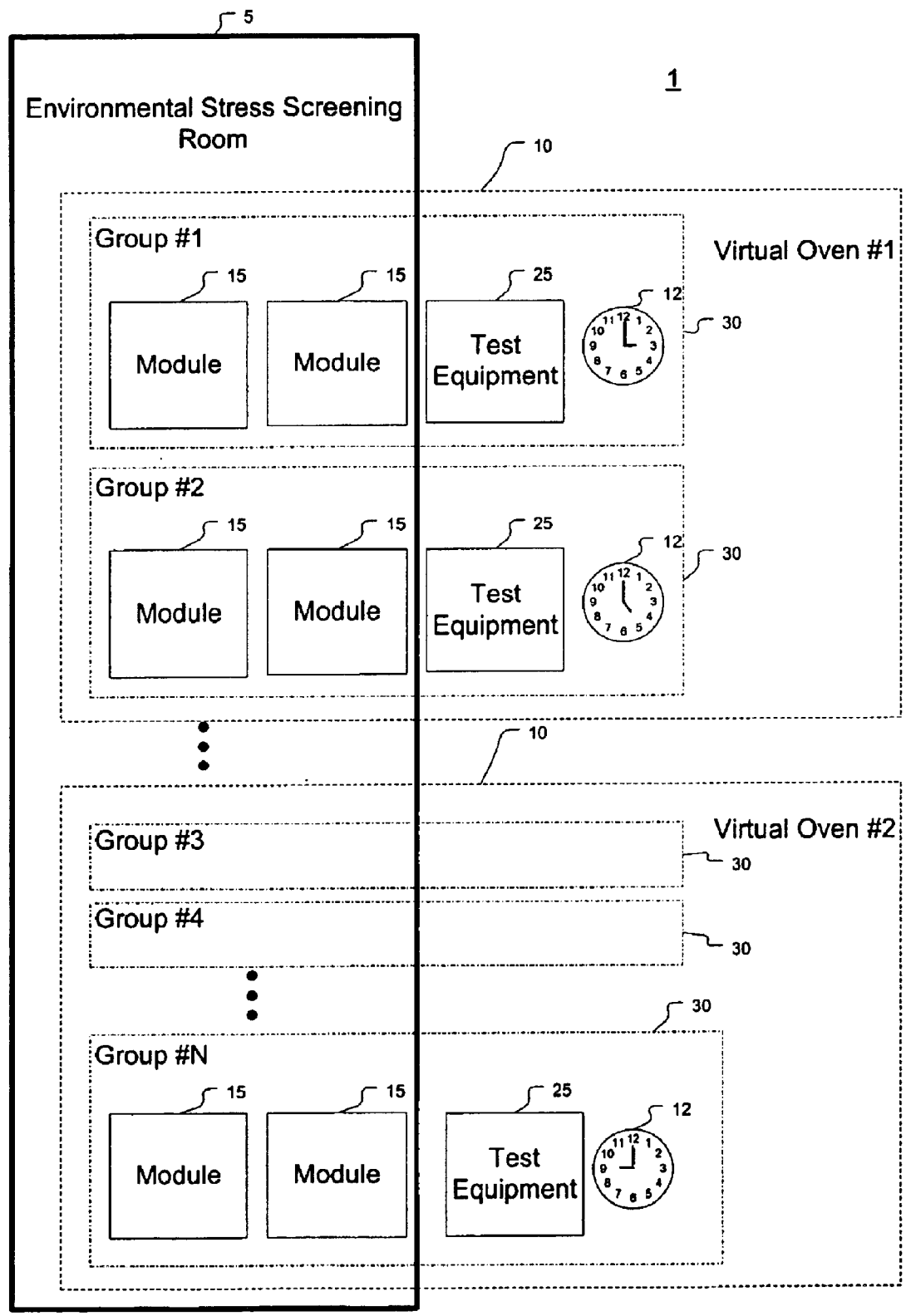
FIG. 1a is a block diagram of the virtual oven concept according to the invention showing logically grouped modules, the association of the test equipment with each logical group, and the arrangement of test equipment outside of an environmental stress screening room.

As shown in FIG. 1a, the inventive system 1 utilizes an environmental stress screening room (ESSR) 5 that is a conventional chamber having known heating and cooling equipment, thermocouples for measuring an internal temperature, and a temperature control unit. Such ESSR's are commercially available from a variety of companies. The ESSR 5 is typically controlled to change its internal temperature according to a predefined temperature profile such as the one shown in FIG. 2.

Although the invention is primarily intended to subject modules 15 to a temperature profile, the ESSR 5 is not limited to merely changing its internal temperature. Indeed, any form of environmental stress parameter such as humidity, radiation, vibration or a combination thereof may be used to stress the modules 15 under test. The invention is also capable of introducing noise into the test signal and/or degrading the test signal strength to apply other forms of stress to the modules 15 under test.

FIG. 1a illustrates the logical grouping 30 that is a key aspect of the virtual oven 10. Conventional burn-in systems require modules being tested to be physically adjacent. A logical grouping 30 of modules groups modules 30 that are not necessarily physically adjacent. For example, different equipment racks can be used to hold the modules of a logical group while they undergo burn-in testing.

Also, an equipment rack may be partially loaded with modules and each module loaded in the partially filled rack designated as a logical group 30 by the inventive software. When the equipment rack is then filled, those modules may form another logical group 30. Such logical grouping 30 permits the invention to be highly modular and adaptive to the manufacturing environment.

Figure 1B:
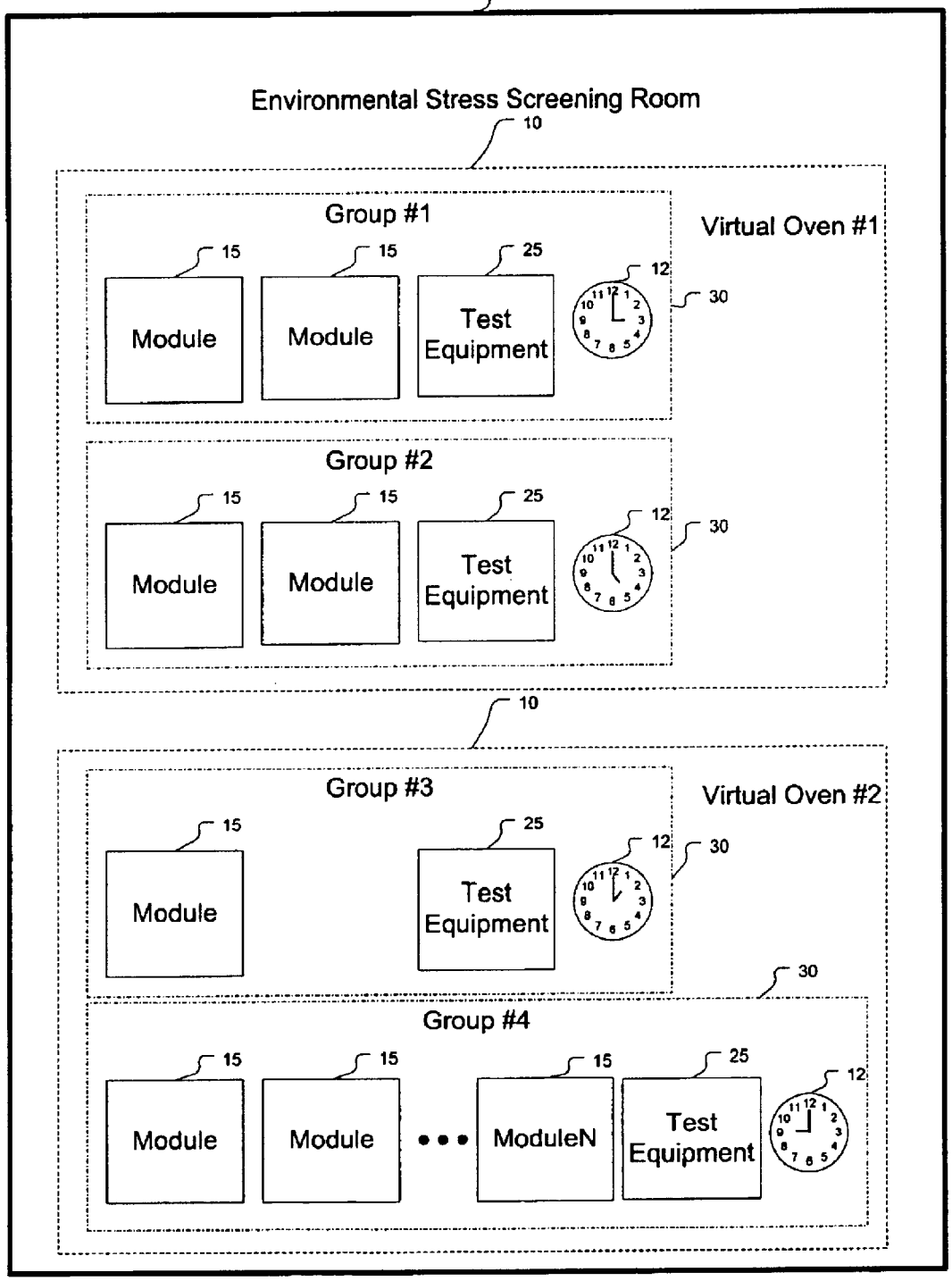
FIG. 1b is a block diagram of the virtual oven concept according to the invention showing logically grouped modules, the association of the test equipment with each logical group, and the arrangement of test equipment inside of an environmental stress screening room.

The ESSR 5 may include one or more virtual ovens 10, but preferably there is more than one virtual oven 10 per ESSR 5 as shown in FIGS. 1a and 1b. Each virtual oven includes one or more logical groups 30 of modules 15 and associated test equipment 25.

In practice, the virtual oven will include a large number of logical groups 30 but at a minimum each virtual oven will include at least one logical group 30. The number of modules 15 within each logical group 30 may also vary but a typical number is two to eight modules 15 per logical group.

Furthermore, each logical group 30 within the virtual oven 10 includes an associated clock or timer 12 that is started after the logical group 30 of modules 15 is loaded into the ESSR 5 and when the testing of that logical group 30 begins.

The virtual oven 10 logical module grouping concept and associated control permits the invention to be highly modular and adaptive to the manufacturing production line feeding modules 15 to the bum-in system 1. Conventional systems typically load a large batch of modules into an oven, attach test equipment to each module and gather data from the modules as they are being tested. If only a few modules are completed, then only a small portion of the oven would be utilized to conduct the bum-in test with a corresponding gross reduction in oven throughput and efficiency. In other words, the conventional bum-in systems do not permit asynchronous loading and test starting of an arbitrary number of modules.

In contrast, each logical group 30 of each virtual oven 10 provides a modular platform for loading and testing an arbitrary number of modules 15. As batches of modules 15 are completed, the logical groups 30 may be loaded and a corresponding bum-in test started. When the next batch of modules 15 is completed another logical group 30 within the same or a different virtual oven 10 can be loaded and another bum-in test started.

FIG. 1b further extends the virtual oven 10 concept. As shown in FIG. 1b, all or most of the equipment for a virtual oven 10 can be physically located within the environmental stress screening room 5. Particularly, the test equipment 25 and timer 12 associated with each logical group 30 of each virtual oven 10 may be physically located within the environmental stress screening room 5. This alternative is generally not preferred because the test equipment 25 would be subjected to repeated environmental stress cycles as each logical group 30 of modules 15 is subjected to a bum-in test.

It is also possible for a virtual oven 10 to span more than one environmental stress screening room 5. As described above, the invention divorces the conventional physical relationship of test equipment with the modules under test and replaces such conventional solutions with a logical grouping 30 of modules 15 and associated test equipment 25. Having a virtual oven include more than one physical ESSR 5, however, is generally not preferred because it complicates the connections and control routines as well as the logistics of physically loading and unloading the physical ESSRs 5.

The virtual oven concept also permits logical groups 30 of modules 15 within one or more ESSRs 5 to be subjected to different environmental stresses. If two or more logical groups 30 are located within a single ESSR 5 (the generally preferred embodiment) then different environmental stresses may be applied by applying a different control regime and perhaps using additional equipment for different areas within the ESSR 5.

For example, some logical groups 30 of modules 15 may be denser than others such that they have a greater thermal mass and greater hysteresis. To compensate for these differences, fans may be added to the ESSR 5 pointing at the logical group 30. In this case, the modules 15 of this particular logical group 30 would preferably be physically located in the same area. By using and controlling the fans, for example, a different environmental stress could be applied to that particular logical group.

As stated above, any form of environmental stress parameter such as humidity, radiation, vibration or a combination thereof may be used to stress the modules 15 under test. The virtual oven 10 and/or the logical groups 30 may be used as a basis to apply additional or different stressors to the constituent modules of the group 30 or virtual oven 10. For example, a vibrator or radiation source could be applied to some of the virtual oven(s) 10 or logical group(s) 30 to apply vibration and/or radiation thereto while the ESSR(s) 5 apply a thermal cycle to these and other virtual ovens 10 and logical groups 30 therein.

Figure 3:
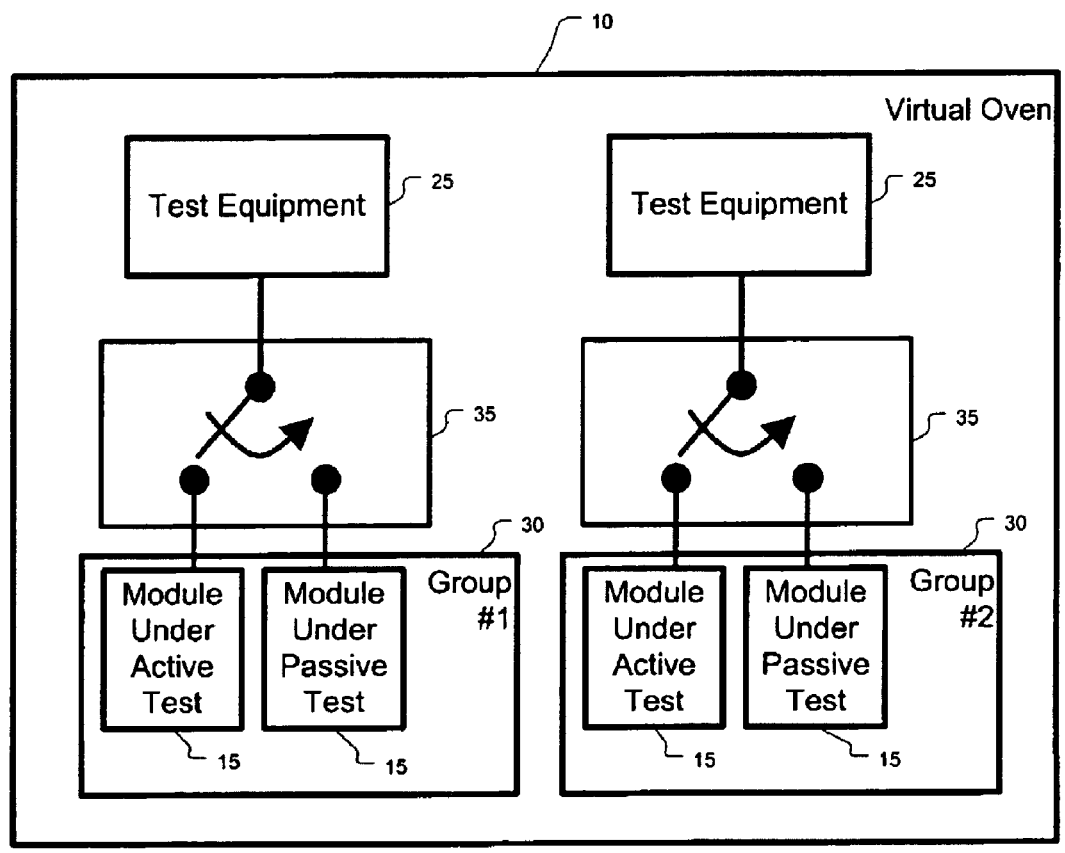
FIG. 3 is a block diagram showing switches that permit the test equipment to be time-shared among modules of a logical group.

FIG. 3 illustrates another concept of the present invention, which is to time-share test equipment 25 between different modules 15 of the same logical group 30. Such time-sharing of test equipment 25 is particularly advantageous when the test equipment is expensive or in short supply because it allows fewer sets of test equipment 25 to enable the system 1. For example, if the modules 15 are optical communication modules then the test equipment 25 may include very expensive test equipment (e.g. Tektronix® ST 2400 Test Set) costing tens or even hundreds of thousands of dollars per test equipment set.

To enable such time-sharing of test equipment 25, the virtual oven 10 includes a switch 35 interposed between the test equipment 25 and the logical group 30 of modules 15 under test. As will be further explained below in the operation section, during a first time period the switch 35 routes test signals between the test equipment 25 and the module 15 under active test. During this first time period, a second module 15 (labeled "module under passive test") is not connected to the test equipment 25. During a second time period, the switch 35 changes position and rotates the test cycle so that the module 15 previously under active test is now passively tested and vice versa.

Although FIG. 3 shows a two-pole switch 35 to accommodate two modules 15 under test, it is to be understood that more than two modules can time-share the associated test equipment 25. In addition, the invention may switch between different active tests instead of or in addition to switching between active and passive tests. In other words, the test cycle rotation may be between different types of active tests, different types of passive tests as well as various combinations of passive tests and active tests.

Figure 4:
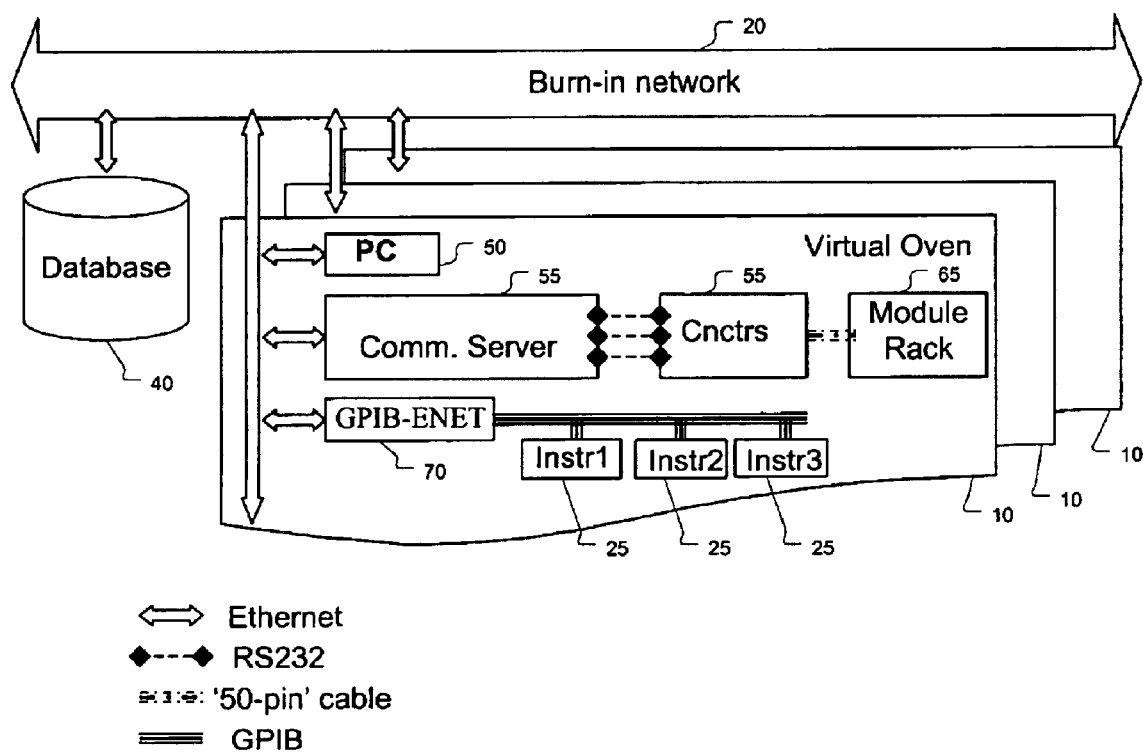
FIG. 4 is a block diagram virtual ovens according to the invention in which the test instruments are connected to the modules via a network and in which plural virtual ovens are connected over the network to a database.

FIG. 4 illustrates the preferred way of connecting the components of the virtual oven 10. In general, a network-based connection is preferred. Particularly, a bum-in network 20 serves as a backbone connecting a plurality of virtual ovens 10 and providing a pathway to the common database 40.

As further shown in FIG. 4, each virtual oven 10 includes an extension of the bum-in network 20 to which are connected a PC (personal computer) 50, a communications server 55 and a GPIB-ENET 70. A plurality of test equipment (labeled "instr 1, instr 2, etc") 25 are connected to the bum-in network 20 backbone via the GPIB-ENET 70. A module rack 65 and connectors 55 provides a way of physically loading the modules 25 into the virtual oven 10.

By using a network architecture such as the one shown in FIG. 4, each of the test 15 instruments 25 is available to test any of the modules 15 loaded onto the module rack 65. Specifically, the bum-in network 20 backbone, communications server 55 and GPIP-ENET 70 are controlled by, for example, PC 50 to route active test signals between the test instrument 25 and the module 15 being tested.

Similarly, passive test measurement values may be routed from the modules 15 to 20 the PC 50 and commands may be routed from PC 50 to the module(s) 15 and/or test equipment. The passive test measurement values may be gathered by the electronics on board of each module 15 and/or by sensors external to the module 15. These passive test measurement values vary depending upon the module 15 being tested but typically include such things as temperature, current, voltage and other parameters internal to the module 15 being tested. The AMS controller 100 associates the particular passive test measurements (or evaluation thereof) with the current module 15 under test so that the database 40 may track the performance or failure of each module 15.

In contrast, the active test routes an active test signal to the module 15 which processes the test signal and sends a processed test signal to the PC 50. The active test is a functional test of the module 15 and the processed test signal sent to the PC 50 is indicative of the functions performed by the module 15.

Although the network architecture shown in FIG. 4 utilizes particular types of connections and protocols such as GPIB, Ethernet and RS232 it is to be understood that other types of connections and protocols are contemplated herein. A relevant point is that the test equipment 25, modules 15, controller (e.g. PC 50), and database 40 are disposed on a network architecture that can be controlled to route test signals, commands, and measurements as desired by the methods of the invention.

Figure 2:
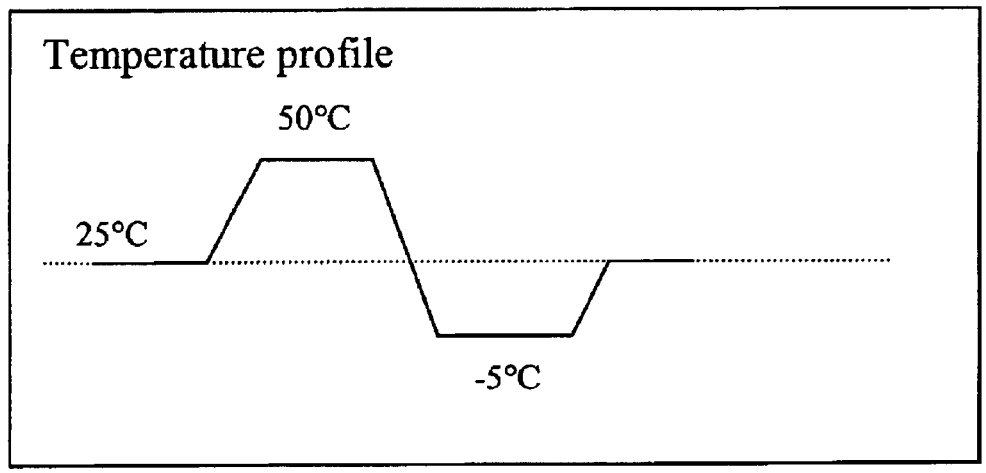
FIG. 2 is a conventional temperature profile showing how the temperature of the environmental stress screening room may be changed.
Figure 5:
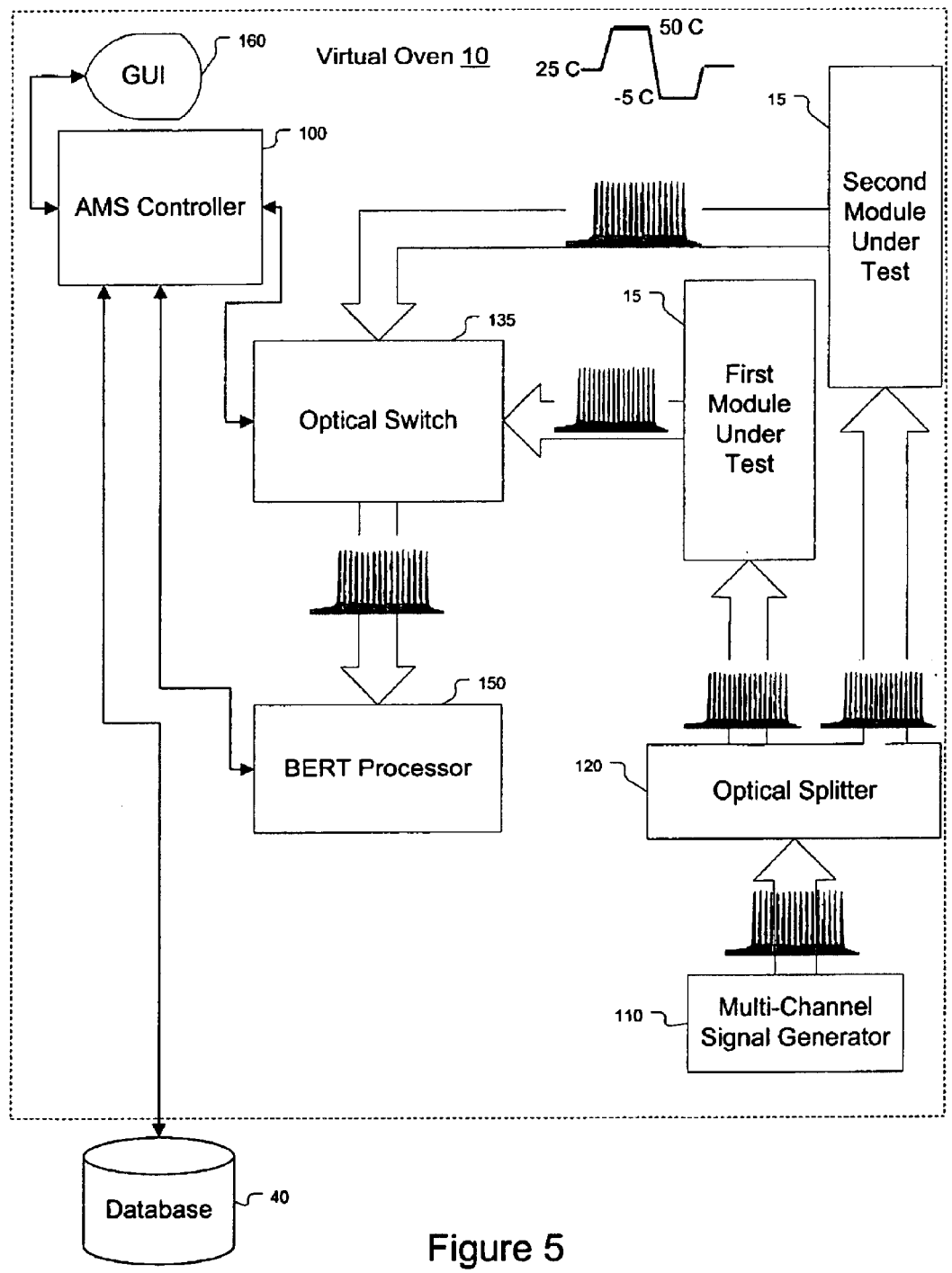
FIG. 5 is a block diagram showing operative connections within a virtual oven testing optical communications modules.

FIG. 5 shows another embodiment of the invention in which the virtual oven 10 subjects modules 15 to a burn-in test (graphically illustrated by the temperature cycle like the one shown in FIG. 2). In this case, the modules 15 under test are multi-channel optical communications modules capable of handling a plurality of channels. For example, the modules 15 under test may be multi-channel (e.g. DWDM) transmitters, receivers, remodulators, selectors or transceivers.

As further shown in FIG. 5, a multi-channel signal generator 110 generates a multi-channel signal 112, which is graphically illustrated therein. An optical splitter 120 connected to multi-channel signal generator 110 splits the multi-channel and provides the split multi-channel signal to each of the modules 15 under test (the first and second modules under test, it being understood that more than two modules 15 may be accommodated by the virtual oven 10 as explained above in relation to FIGS. 1a and 1b).

Each of the modules 15 under test processes the multi-channel signal and sends the processed result to optical switch 135. The optical switch 135 is also connected to AMS controller 100 that controls which of the processed multi-channel signals are sent to the BERT processor 150. As further explained below in relation to the flowchart of FIGS. 9a and 9b, AMS controller 100 controls optical switch 135 on a periodic basis in order to time-share the BERT processor 150 among the modules 15 under test.

Although the output from only one module 15 is analyzed at a time by BERT processor 150, it is still quite useful to feed all of the modules 15 of the logical group 30 with a multi-channel signal. The reason is that the multi-channel signal exercises the modules 15 more completely than simply providing power to the modules. In other words, each module 15 under test is actively processing the multi-channel signal that requires powering internal components such as lasers and thereby subjects each modules to a widerange of functional testing and stress.

The BERT processor 150 performs a conventional bit error rate test of the multi-channel signal processed by the current module 15 under test. BERT processor 150 may be implemented with a variety of standard or specially designed test equipment capable of performing a bit-error rate test. The results of then bit error rate test are fed to AMS controller 100 for analysis and/or storage in database 40. The AMS controller 100 associates the particular bit error rate test with the current module 15 under test so that the database 40 may track the performance or failure of each module 15.

A graphical user interface (GUI) 160 is preferably connected to the AMS controller 100. GUI 160 allows an operator to view the test result, monitor the virtual oven 10 and control the virtual oven 10 in a manner more particularly described below. GUI 160 may be implemented with a conventional cathode ray tube, liquid crystal or other display technology. If a touch screen is utilized as illustrated in FIG. 5, then a separate input device is not necessary. Of course, separate input devices (not shown) such as a mouse or keyboard may be added so that an operator can interact and control the virtual oven(s) 10.

Figure 6A:
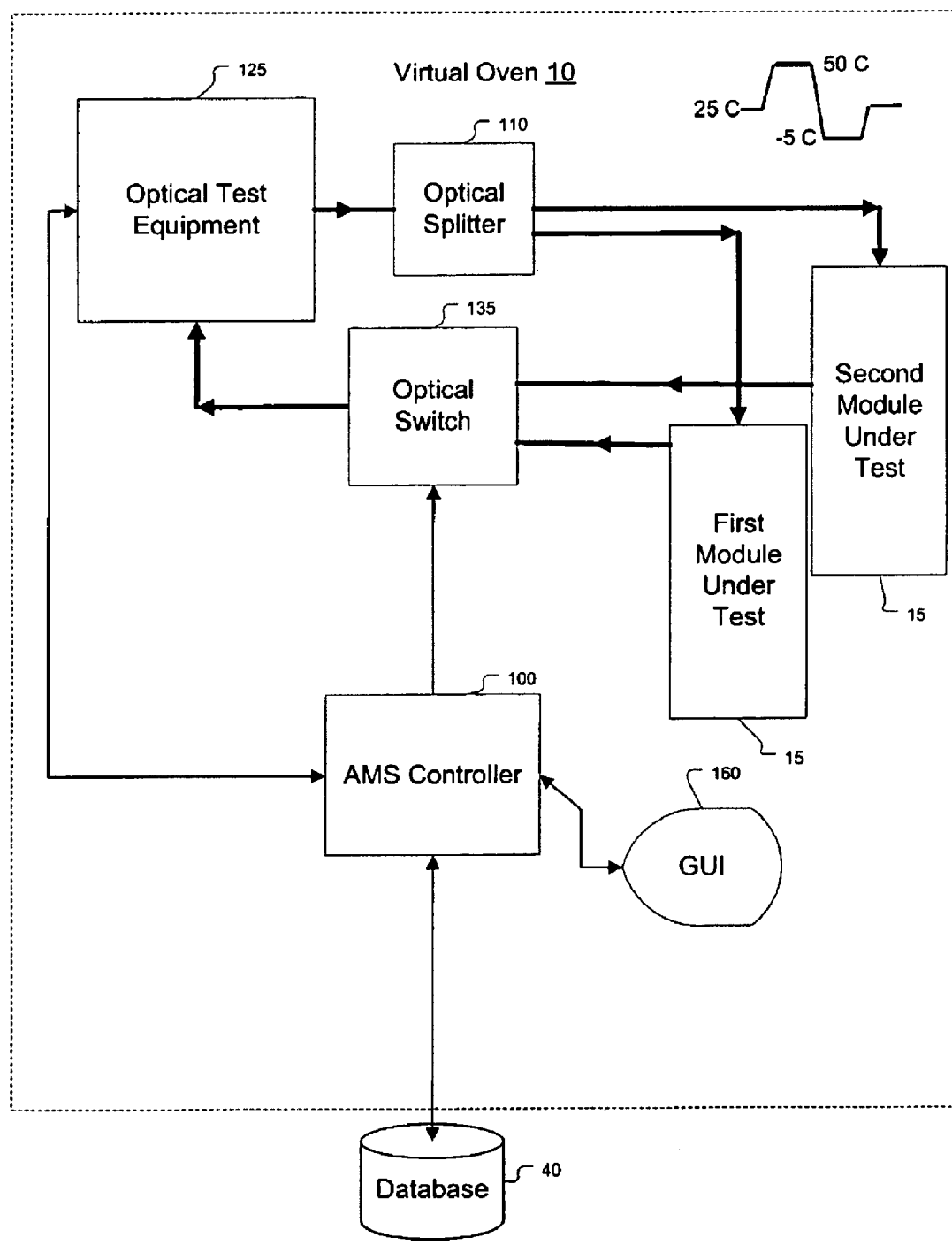
FIG. 6a is a block diagram showing alternative equipment and operative connections within a virtual oven testing optical communications modules.

FIG. 6a illustrates another implementation of the virtual oven 10 has many similarities to the system shown in FIG. 5. As shown in FIG. 6a, a single SONET/SDH test equipment 125 is utilized instead of the BERT processor 150 and multi-channel signal generator 110 of FIG. 5. Moreover, the signals fed to the modules 15 under test are not necessarily DWDM or other multi-channel signals. Instead, any optical signal may be supplied by the SONET/SDH test equipment 125 via optical splitter 110 to conduct any desired optical test.

The optical signals processed by the modules 15 under test are supplied to the optical switch 135. AMS controller 100 controls optical switch 135 in the same manner described above in relation to FIG. 5 to time-share the SONET/SDH test equipment 125 between the plurality of modules 15 under test.

Figure 6B:
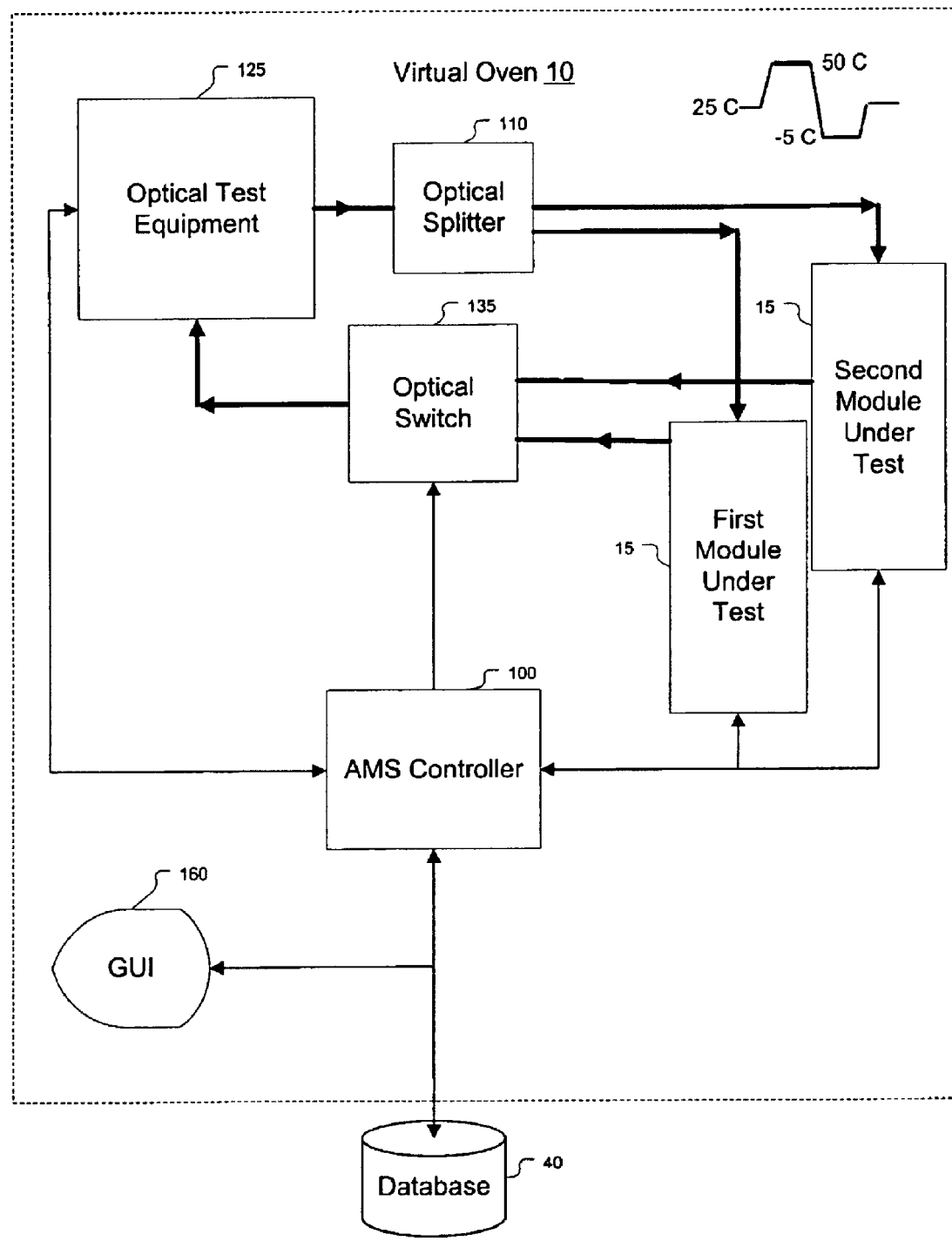
FIG. 6b is a block diagram showing additional alternative operative connections within a virtual oven testing optical communications modules.

FIG. 6b illustrates another aspect of the invention. Namely, the virtual oven 10 illustrated in FIG. 6b permits passive testing of the modules 15. Passive testing includes self-monitoring by the modules in which test equipment included within (or added to) each module 15 may perform a test. For example, the passive test may be sensing the temperature of components such as a Bragg grating, laser diode, or other component. The module 15 may include temperature sensor(s), voltage sensors, or other test equipment that conducts passive testing of module 15 components.

The passive test measurements or results thereof are supplied by the modules 15 to the AMS controller 100 as indicated by the signal line connecting these elements. The AMS controller associates the test measurement and/or results with the particular module 15 being passively tested and supplies this data to the database 40.

Figure 6C:
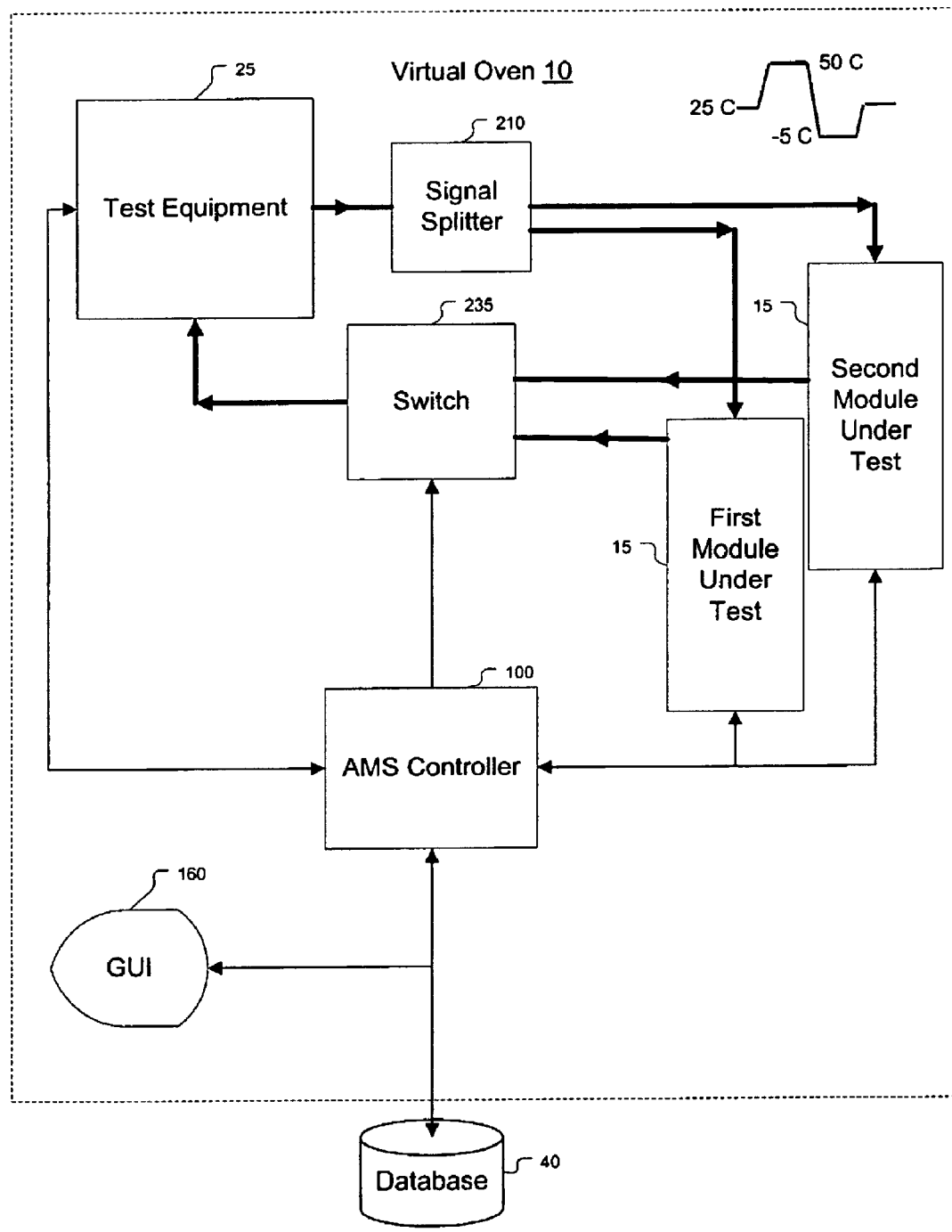
FIG. 6c is a block diagram showing operative connections within a virtual oven testing generalized modules.

FIG. 6c is similar to FIG. 6b but illustrates that the invention may be generalized to modules 15 other than optical communications modules. Specifically, a generalized test equipment 25 is used instead of the application specific BERT processor 150 of FIG. 5 or the SONET/SDH test equipment 125 shown in FIG. 6b.

The generalized test equipment 25 illustrated in FIG. 6c may perform any desired electrical, optical, electro-optical or other test on the modules 15 by supplying a signal thereto via signal splitter 210. The signals processed by the modules 15 are then fed back to the test equipment 25 via switch 235. AMS controller 100 controls switch 235 on a periodic basis in order to time-share the test equipment 25 between the plurality of modules 15 under test.

Figure 6D:
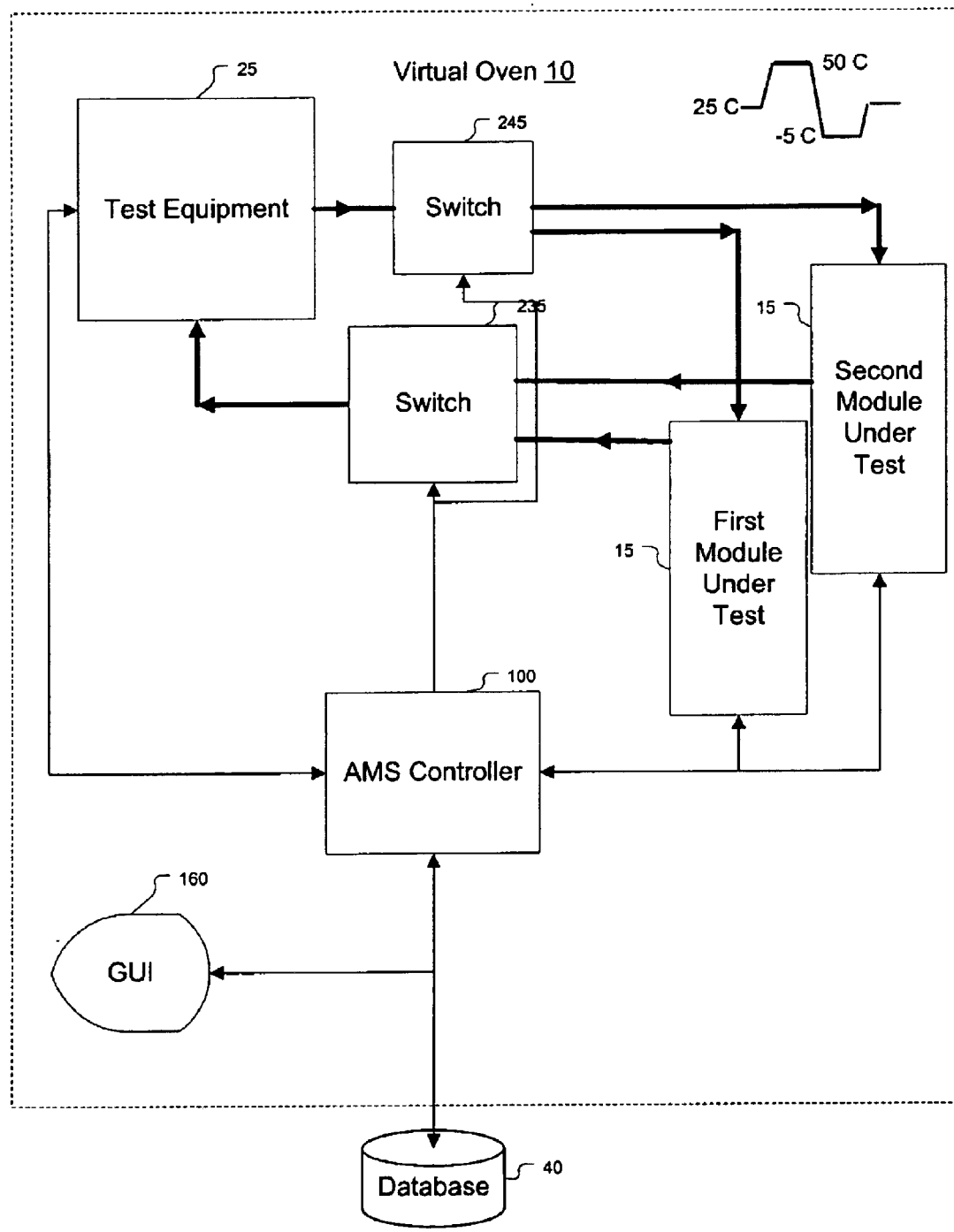
FIG. 6d is a block diagram showing alternative equipment and operative connections within a virtual oven testing generalized modules.

FIG. 6d illustrates another alternative of the invention, which is to utilize switch 245 in place of the signal splitter 210 of FIG. 6c. This alternative is not preferred because it does not exercise all of the modules 15 under test to the same degree as when an active signal is fed to the module 15. However, it is possible to use a switch 245 instead of a splitter 210. The switch 245 is controlled by AMS controller 100 in the same fashion and, preferably, at the same timing as switch 235 so that the signals from test equipment 25 may be routed to a particular module 15 under test and so that the processed signal may be routed back to the test equipment 25 for evaluation.

Another alternative is to apply a more than one test signal to the modules 15. For example, an active test signal may be combined with a noise signal in order to test the noise tolerance of module 15. Furthermore, different type of active test signals may be sent simultaneously or in succession to the modules 15 under test in order to perform a variety of tests.

Figure 6E:
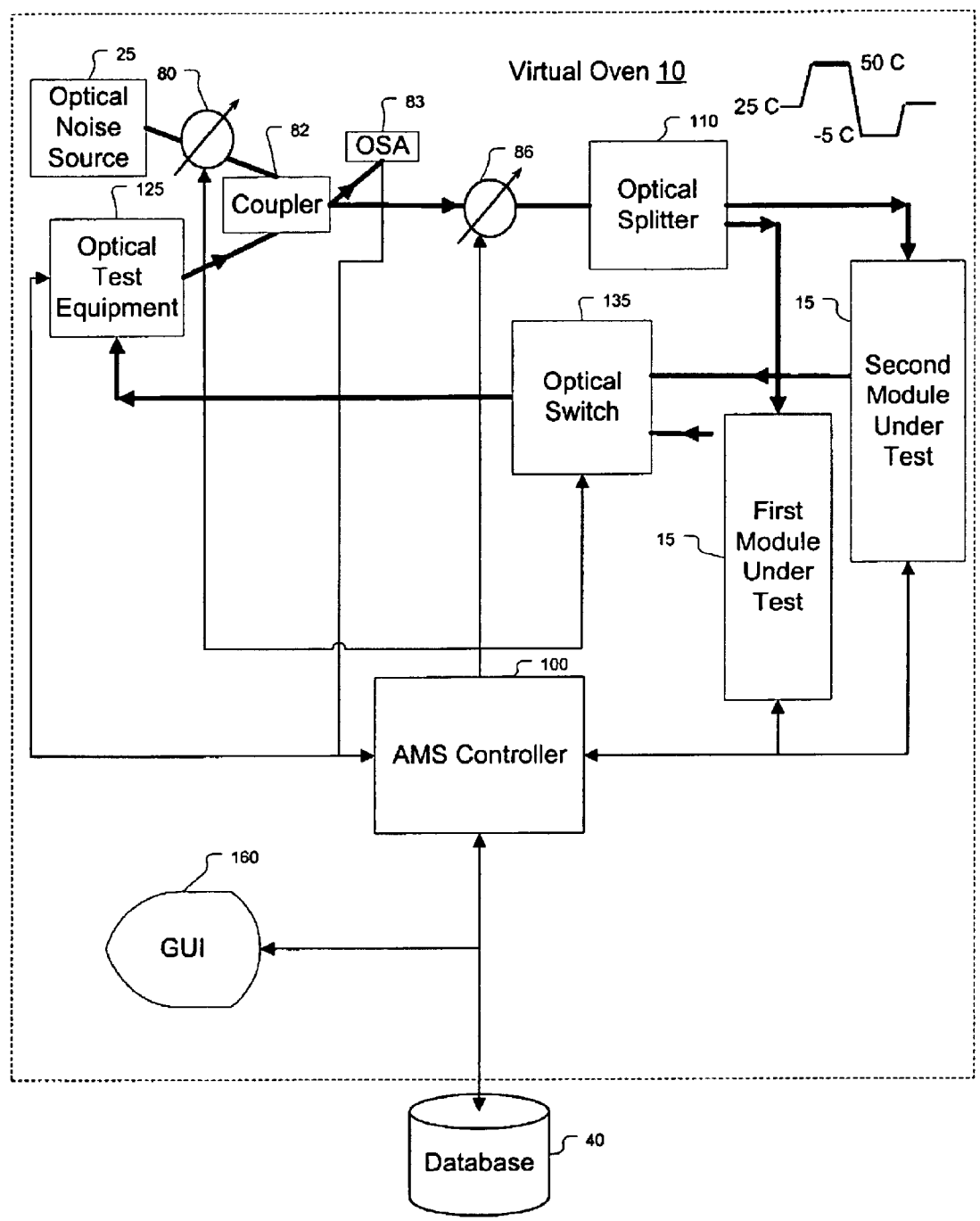
FIG. 6e is a block diagram showing alternative equipment and operative connections within a virtual oven testing optical communications modules and capable of noise-loading and/or degrading the test signal strength.

FIG. 6e illustrates an implementation for stress testing the modules 15 by adding noise to the test signal and/or degrading the test signal strength. In general, VOAs (variable optical attenuators) 80, 86 and an optical noise source 25 may be utilized to degrade the test signal strength and add an adjustable amount of noise to the test signal. More specifically, an optical noise source 25 may inject noise into the optical test signal via coupler 82.

The strength of this injected noise may be adjusted by the VOA 80. The OSA 83 may be used to measure amount of noise (e.g. measure the optical signal-to-noise ratio (OSNR)) and send such measurements to the AMS controller 100. The AMS controller 100 may then use measurements to control the OSNR by adjusting the VOA 80. As an alternative, the OSNR may also be adjusted by using a VOA in the test signal path and adjusting the test signal strength relative to the noise signal strength.

The strength of the combined noise and test signal may also be adjusted with VOA 86 under the control of AMS controller 100. In other words, the total signal strength of test signal plus noise may be degraded to place additional stress on the module 15 under test. For example, the module 15 may be a receiver and it is often quite useful to see how tolerant the receiver is to a weak signal or a weak and noisy signal. The AMS controller 100 can place such stress on the receiver by adjusting the VOAs 80, 86.

Moreover, the noise measurements may also be stored in database 40 and used, for example, to calculate a pass/fail value for the module under test 15.

The optical noise source 25 may be constructed in various ways. A preferred construction is an ASE (amplified spontaneous emission) source. If the module 15 under test is a DWDM module the spectrum of the ASE should be flat so that a more-predictable amount of noise may be added to each channel of the DWDM signal.

The idea of noise loading in which noise is added to the test signal (e.g. such as with the configuration of FIG. 6e) is particularly useful when testing modules 15 having error correcting functionality. A prime example of such error correction functionality that is widely used in the optical communications field is FEC (forward error correction) in which error correcting codes are incorporated into the signal and then used to correct errors that may be detected at the receiver. Such FEC circuits are quite capable of eliminating most communications errors.

Indeed, FEC circuits are almost too successful when it comes time to test a module incorporating FEC. The FEC will mask errors during the testing process such that the true performance of an FEC module will not be known. By noise loading the FEC modules, however, one can gauge the performance thereof more accurately and consistently. In other words, the FEC algorithm may correct for defects in other portions of the module 15 under test such that the performance under degraded signal conditions is unsatisfactory; this can be seen by providing a degraded, or noise loaded, signal during test. Also, the FEC circuitry (e.g. an ASIC is typically used) may also have defects, and these are more easily seen with a signal requiring extensive error correction. The coupling of this noise loaded condition with temperature cycling enables parallel testing of the FEC capability and other module defects, such as component infant mortalities and solder defects.

The switches (e.g. 235, 245) and splitters (e.g. 210) used by the invention are commercially available and conventional elements and will, therefore, not be discussed further herein.

The AMS controller 100 may be implemented in a variety of ways including a personal computer (PC) loaded with software to be more fully described below, an ASIC (application specific integrated circuit), firmware, etc. It is generally preferred to use a PC for AMS controller 100 because of the low cost, wide-availability, and easy programmability of PCs. It is also preferred to use one PC and associated display terminal per virtual oven 10. In this way, there can be provided one GUI 160 per virtual oven 10 that enables rapid understanding and control of each virtual oven 10.

Likewise, the database 40 may be implemented with a variety of devices such as a conventional database program specially configured to store and organize the data generated by the invention. The memory device storing the database 40 may be local to the AMS controller 100, but it is preferred to utilize a networked arrangement such as that shown in FIG. 4 which permits the database 40 to be accessed by any of the individual AMS controllers 100 associated with each of the virtual ovens 10.

Figure 7:
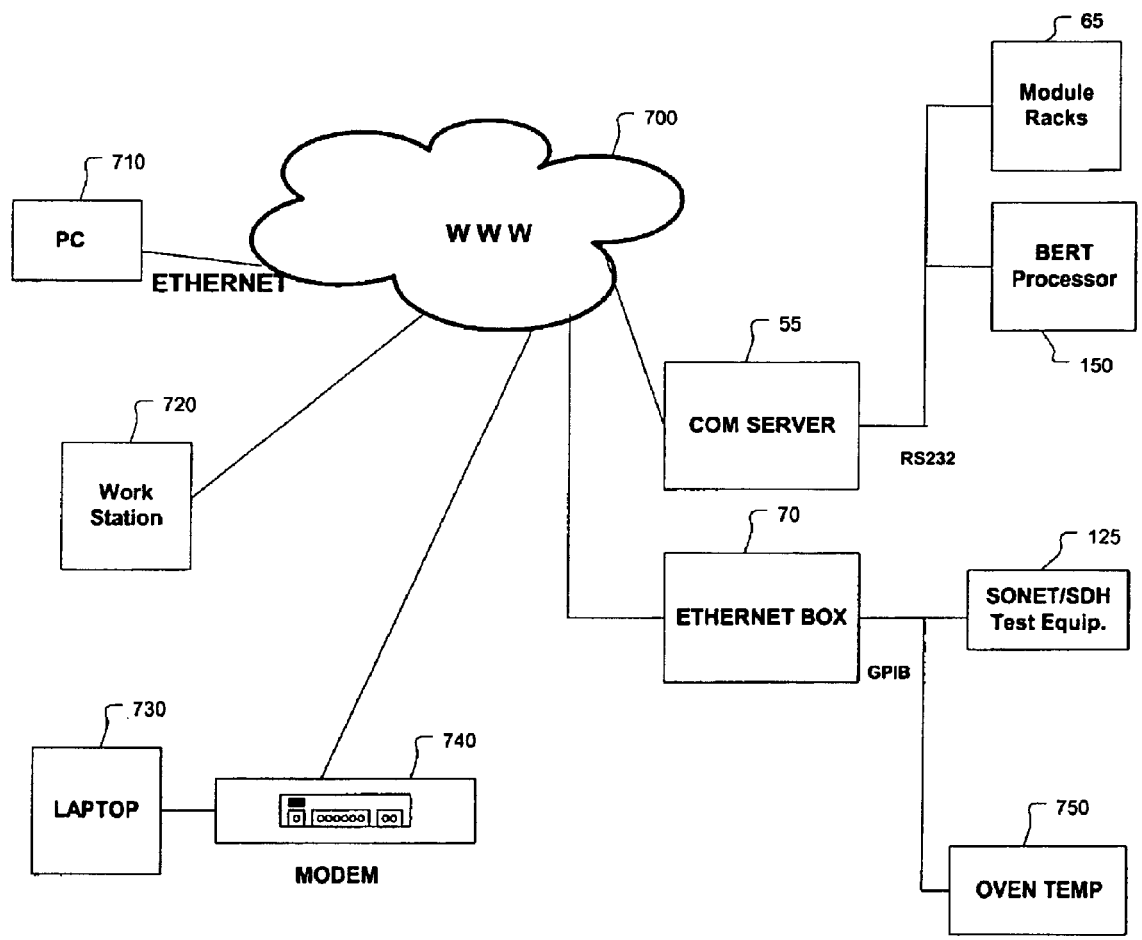
FIG. 7 is a high-level block diagram showing an Internet-based architecture for connecting various components of the invention.

FIG. 7 illustrates an alternative web-based architecture according to the invention. The WWW (World-Wide-Web) 700 is utilized as a medium to interconnect the components of the invention in a manner similar to that shown in FIG. 4.

More specifically, the modules 15 (not shown) are loaded onto the module racks 65 which, in turn, is connected to the WWW 700 via a communication server 55. Likewise, a BERT processor 150 is connected to the WWW 700 via communications server 55.

FIG. 7 further specifies and R-S232 communication protocol between the modules racks 65 and the communication server 55 but it is to be understood that a variety of other communications protocols could be used.

An Ethernet box 70 provides connectivity between the WWW 700 and SONET/SDH test equipment 125. The temperature of the ESSR may be monitored by oven temp sensor 750 the reading of which may be forwarded to the WWW 700 via Ethernet box 70. Again, the Ethernet protocol is merely an example of the variety of communications protocols that may be used by the invention.

To permit remote access to the virtual oven 10, a laptop 730 and/or workstation 720 are provided. Laptop computer 720 may be connected to the WWW 700 via a MODEM 740. Workstation 720 may be directly connected to the WWW 700 as shown.

PC 710 may also be connected to the WWW 700 as further shown in FIG. 7 via an Ethernet connection. The PC 710 is intended to serve as the AMS controller 100. With the configuration shown in FIG. 7 a fully functional web-based remote control and monitoring system maybe utilized to monitor and control the virtual oven 10.

Operation of the Invention

Figure 8:
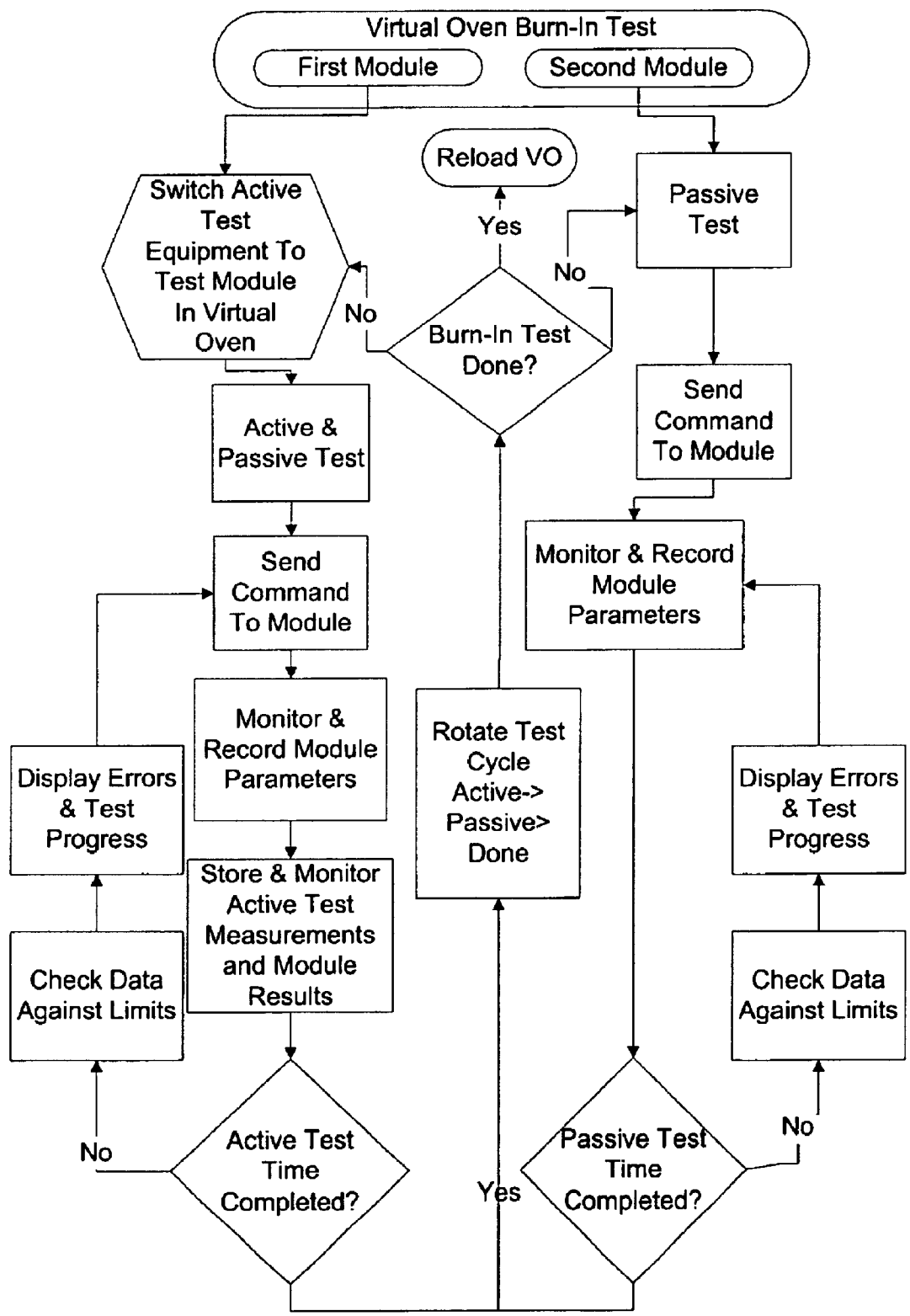
FIG. 8 is a flowchart showing details of a method of conducting burn-in testing according to the invention for two modules.
Figure 9:
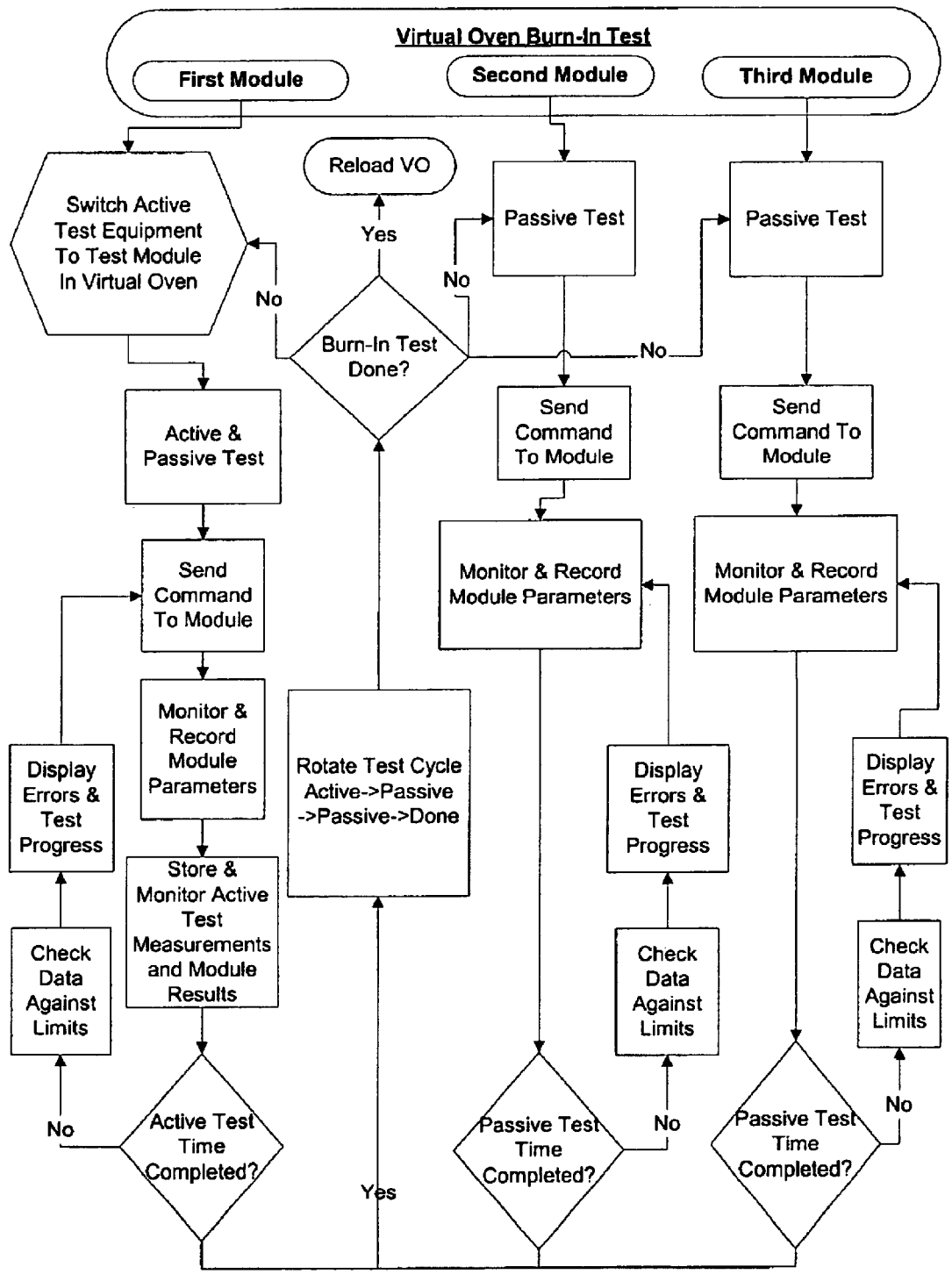
FIG. 9 is flowchart showing details of a method of conducting burn-in testing according to the invention for three or more modules.

FIG. 8 is a flowchart illustrating a method of operation according to the invention. This method is intended for a logical group 30 having only two modules 15. FIG. 9 illustrates the method for three (or more) modules 15 per logical group 30. The method shown in FIGS. 8 and 9 is executed by the AMS controller 100 (or PC 50 of FIG. 4).

As indicated by the start icon in FIG. 8 both modules 15 (labeled "first module" and "second module") may begin their testing at the same time. To keep track of the time, the timer 12 associated with each logical group 30 may be utilized as illustrated in FIGS. 1a and 1b.

Following the processing path for the first module, the bum-in test begins with an active test. The flowchart reflects the preference for continuing the passive testing while the active testing is performed so that more data may be collected for each module 15 under bum-in test.

The initiate the active test, the AMS controller 100 switches the hardware (e.g. by controlling the switch 35, optical switch 135, switch 235, switches 235 & 245 or by controlling the burn-in network 20 and communication server 55) to feed the test signal to the first module in the virtual oven 10.

During the active test, signals are fed to the first module in a manner illustrated in FIGS. 4, 5, 6a–6e or 7; processed by the module 15; and sent back to the test equipment (e.g. test equipment 25, BERT processor 150, or SONET/SDH test equipment 125 which are also called "active test equipment" herein). The signals fed to the first module are sufficient to exercise or otherwise perform an active, functional test of the first module.

The passive test may include sending a command to the module 15 to place the module 15 into a desired state. This step is optional but may be quite advantageous when the module 15 has a variety of operational states. Furthermore, some or all of the operational states may be activated by sending a different command to the module during subsequent iterations of the loop.

The first module is also monitored (passively tested) by the AMS controller 100 which records the passive test results in the database 40. It is preferred that such passive test(s) run in parallel with any active tests in order to gather a fuller complement of test data.

The results of the active test are also stored and monitored (e.g. first module is actively tested the results of which are stored by the AMS controller in the database 40).

The method then checks whether the active test time has been completed. This may be performed by the AMS controller 100 checking the timer 12 associated with the logical group 30 under test. If two modules 15 are being tested as in FIG. 8, then the test cycle may be divided into two even parts such that the first module is actively tested during the first half of the test cycle and the second module is actively tested during the second half of the test cycle.

If the active test cycle is not yet completed for the first module, then the active and/or passive test results (data) are checked or otherwise compared against pre-stored limits (e.g. tolerances). For example, if the BER rate exceeds the tolerance level, then the first module fails the active test. As another example, if one of the monitored parameters (e.g. temperature reading) is outside desired parameters, then the first module may also fail the passive test for that reason. Instead of using a pass/fail criteria, the invention may also flag or otherwise indicate that certain parameters are outside tolerances. Such criteria may be used by the AMS controller 100 to decide whether to subject that particular module 15 to retesting, reworking, or other action. The database 40 may store all such criteria.

The results of this data checking are then displayed by the AMS controller 100 on the GUI 160. Furthermore, the GUI 160 may also display error messages which may be text, graphics or mix of text and graphics.

The active test for the first module continues until it is completed. When it has, the method then rotates the test cycle. In this case, the first module which previously underwent an active test should next be subjected to a passive test. By rotating the test cycle, the method ensures that each module 15 under test undergoes each part of the test cycle.

The method then checks whether the burn-in test has completed (e.g. both modules have been subjected to the active and passive test cycles). If so, then it is time to reload the virtual oven (VO) and create a next logical grouping 30 of modules 15.

The right side of the flowchart in FIG. 8 illustrates the passive test cycle. As mentioned above, the left side actually conducts both active and passive testing. Therefore, the right side is actually a subset of the steps performed by the left half. Therefore further explanation for the passive test cycle is not necessary.

FIG. 9 illustrates a burn-in test for three (or more) modules 15 (labeled first, second and third modules). FIG. 9 is quite similar to FIG. 8 so only the differences therebetween will be highlighted here.

The main difference is the rotation of test cycle step. When three (or more) modules 15 are being tested the full test cycle will include one active test cycle and (n−1) passive test cycles where n is equal to the number of modules 15 in the logical group 30 being tested. FIG. 9 shows three modules so the test cycle (for the first module) is active→passive→passive→done. The other two modules would start in the middle of this sequence as appropriate.

Another difference is the active and passive test cycle times. When three modules 15 are being tested, the total burn-in time may be divided into three equal parts so that the test equipment 25 is time-shared equally between the modules 15 under test. When n modules 15 are being tested, the total burn-in time is divided in n parts.

Alternatively, the test cycle times may be unequal so that, for example, the first module is subjected to the active test for a longer time that the other two modules. The test cycle times may be adjusted by a user via the GUI 160. Unequal test times may be advantageous for re-testing a component or for testing a troublesome component more rigorously than other, less troublesome components. Database 40 tracks each and every module 15 to enable easy identification of such troublesome components and a remedy therefor.

The test cycles may also start asynchronously. In other words, the active test cycle and the passive test cycle may start at different times. This may be particularly helpful when the test cycle durations are unequal. In this way, the testing resources may be most efficiently utilized.

Figure 10:
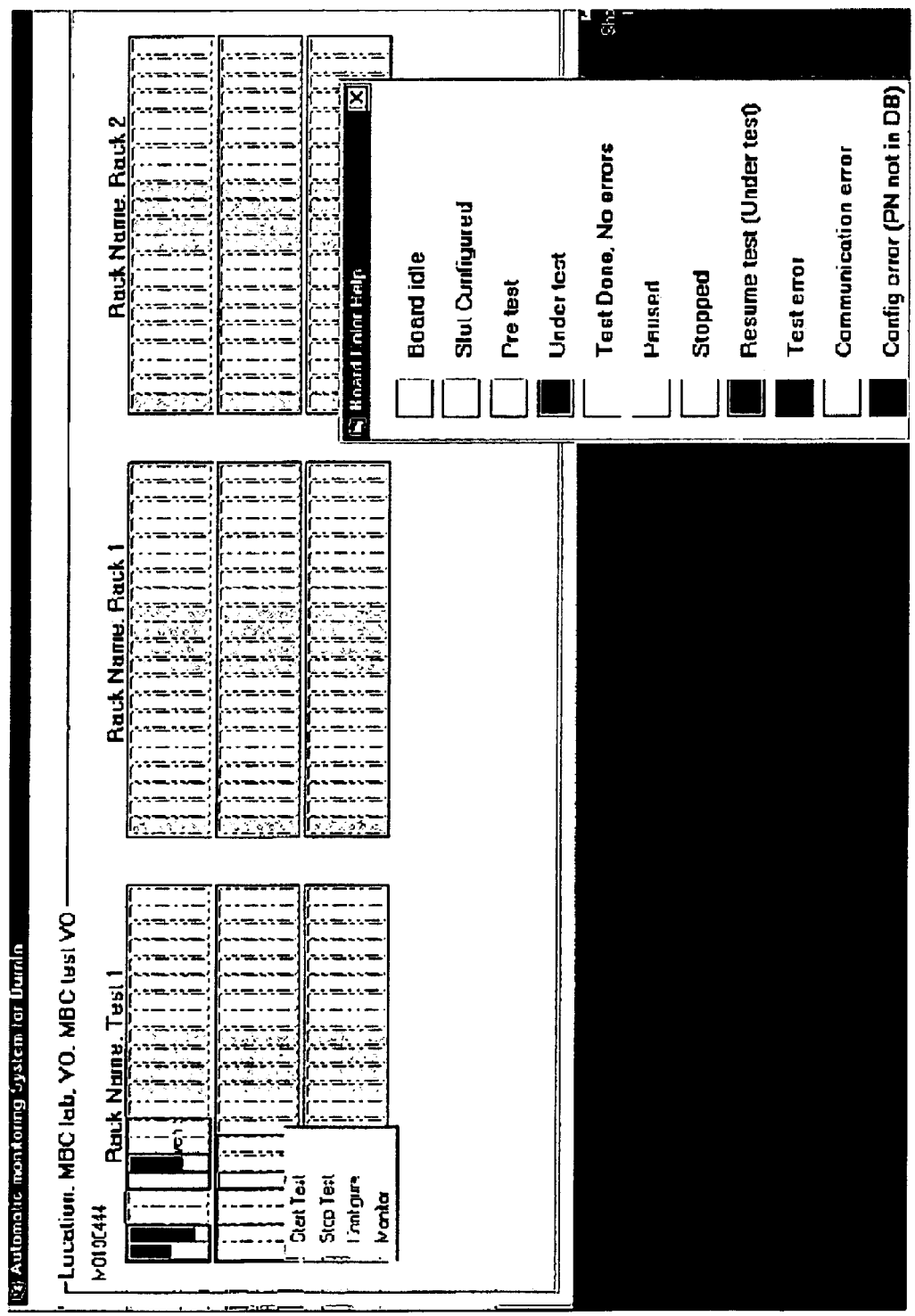
FIG. 10 is a screen display of a graphical user interface according to the invention.

FIG. 10 is an example of the displays that may be generated by the AMS controller 100 and displayed on GUI 160. The preferred display provides a summary view of all modules currently being tested in the virtual oven. The logical groupings 30 are shown and labeled as "Racks" in the display. Each logical grouping 30 or rack includes a plurality of modules 15 under test which is indicated by the plurality of bars within each rack. A gas gauge is overlaid on each bar (representing a module 15). As the test cycle progresses, the gas gauge increases in size.

Preferably the gas gauge overlays are color coded to indicate the test state. The color help menu shown in FIG. 10 illustrates exemplary color codes which may include:

| Test state | Color Code |
| --- | --- |
| Board idle | Light Blue |
| Slot Configured | White |
| Pre Test | Yellow |
| Under Test | Dark Blue |
| Test Done, No Errors | Green |
| Paused | Grey |
| Stopped | Light Purple |
| Resume Test (Under Test) | Purple |
| Test Error | Red |
| Communications Error | Tan |
| Configuration Error | Brown |

Of course, a subset of these test states may be used and the colors may be changed as desired. The range of test states and associated color codes permit an operator to immediately see the test progress of a large number of modules, the success or failure of the various tests, as well as diagnostic information on the burn-in system itself to aid in troubleshooting.

Database Design and Operation

As mentioned above, the database 40 may be implemented with a variety of devices such as a conventional database program specially configured to store and organize the data generated by the invention.

The preferred implementation of the database 40 is shown as database 400 in FIGS. 11–15 but is also referred to herein as a "stress-test information database" since it stores information related to a stress-test of different products as further described below. The term "database 400" is a shorthand notation for the inventive stress-test information database.

Figure 11:
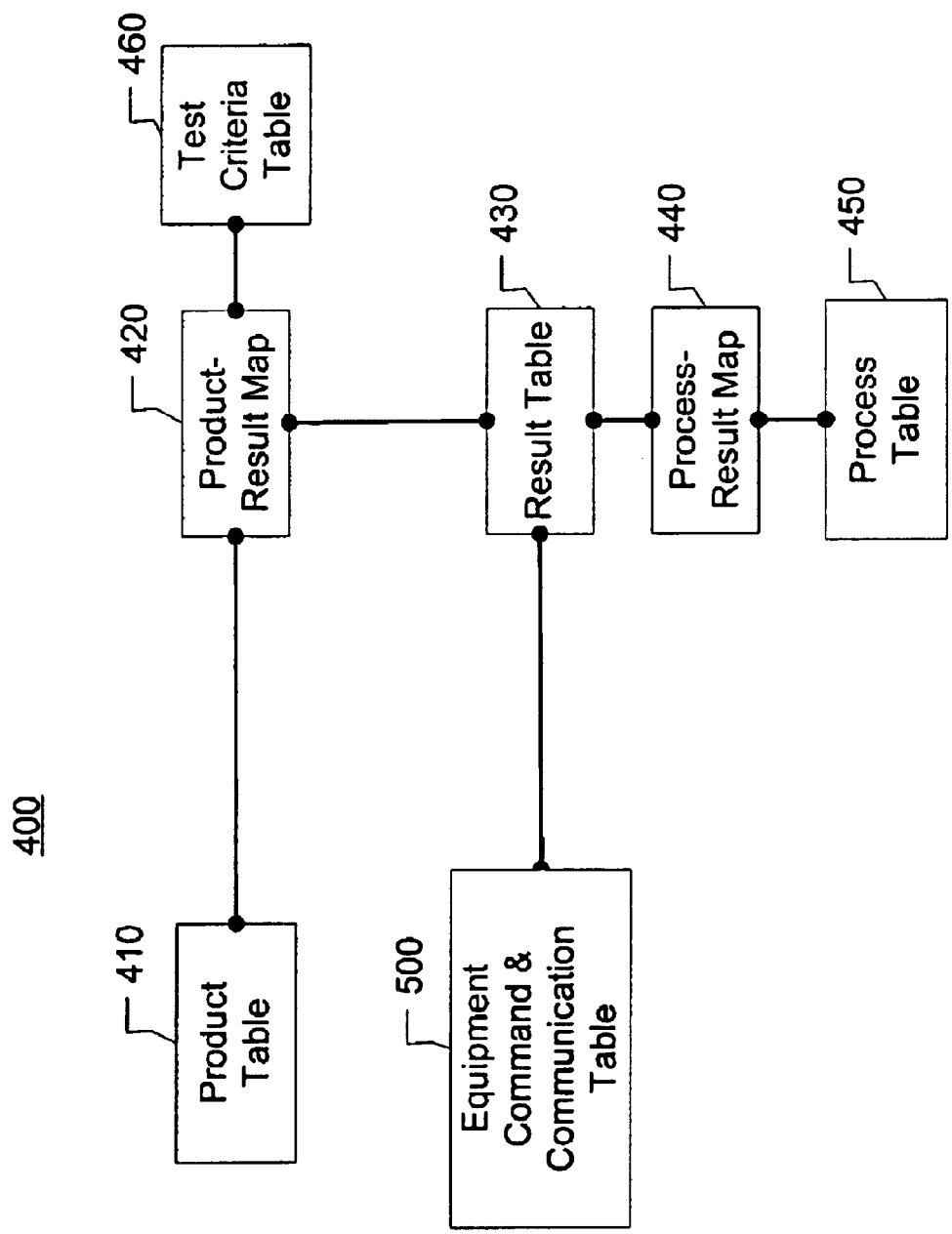
FIG. 11 is a high-level data relationship diagram illustrating the inventive database t ha t may be used with the inventive systems and methods.

FIG. 11 is a high-level data relationship diagram illustrating the preferred inventive database 400. As shown therein, the database 400 includes a variety of data entities having functional data relationships with other data entities. As is known in the art, the data entities are storage containers or tables for each of the respective data subjects and may contain a number of fields to store distinct information items. Moreover and as further described below in relation to FIGS. 12–15, many of the data entities shown in the high-level diagram of FIG. 11 may represent a collection of other data entities and associated data relationships.

The functional data relationships shown in FIGS. 11–15 are designated by dark lines terminated by large dots. As is also known in the art, such functional data relationships may be implemented by, for example, designating keys (e.g. primary key, foreign key, etc) and linking key pairs. Furthermore, the data relationships may be one-to-one, one-to-many, or many-to-many.

Returning to FIG. 11, the design of database 400 includes four main data entities: the product table 410, the result table 430, the process table 450, and the equipment command & communication table 500. The major data associations relate the product table 410 to the result table 430; and the result table 430 to the process table 450; and the result table 430 to the equipment command & communication table 500.

Due to advantageous many-to-many data relationships several additional tables or maps may be utilized as further shown in FIG. 11. More specifically, a product-result map 420 relates the product table 410 to the result table 430. Likewise, a process-result map 440 relates the result table 430 to the process table 450. In addition, the product-result map 420 also relates the result table 430 to the test criteria table 460.

Details of each table will now be described along with the associated functionality and general application of the database 400.

Figure 12:
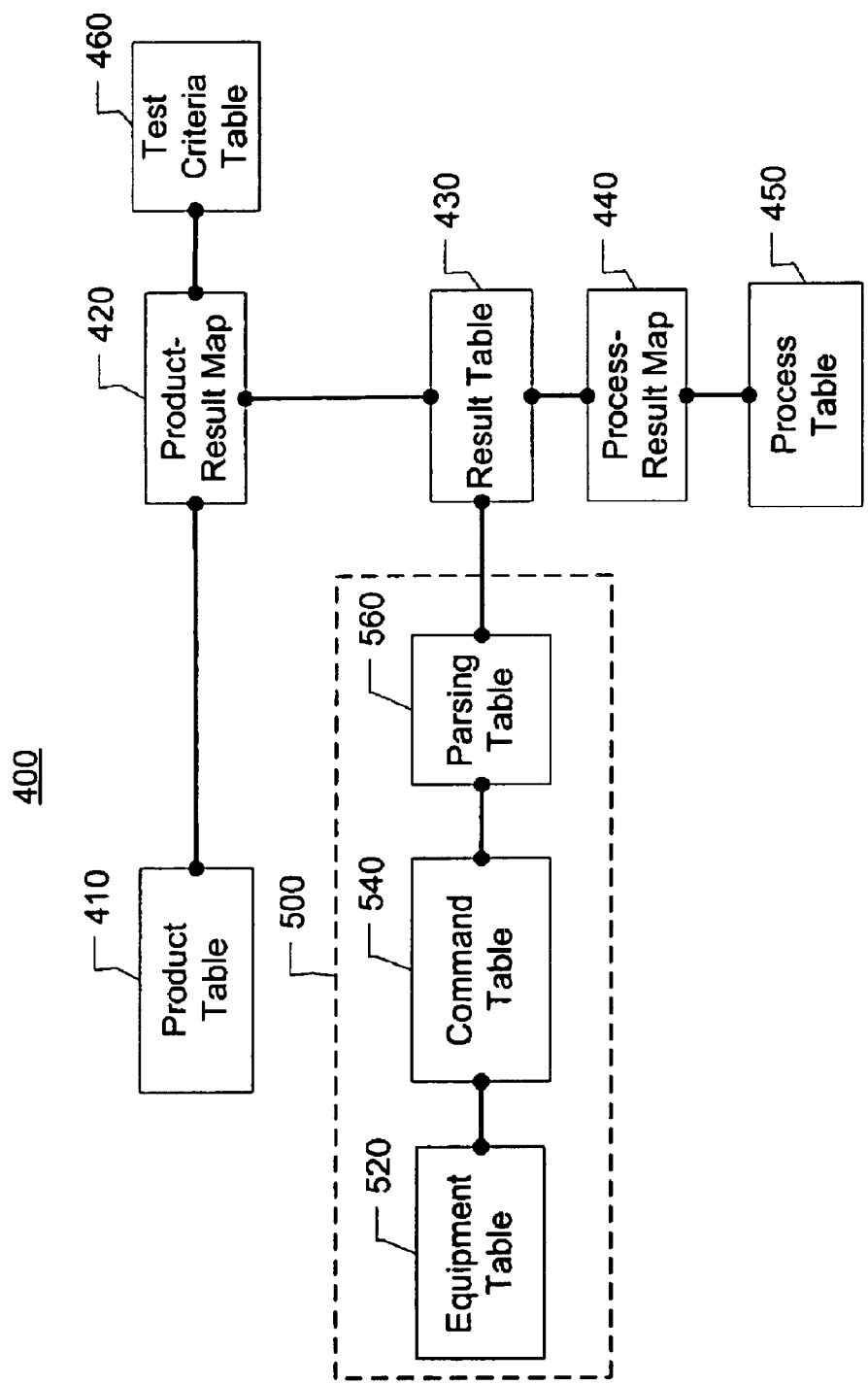
FIG. 12 is a mid-level data relationship diagram illustrating test equipment command and communication table details of the inventive database that may be used with the inventive systems and methods.

The equipment command & communication table 500 of FIG. 11 may include the data entities and data relationships shown in FIG. 12: equipment table 520 is associated with command table 540 which, in turn, is associated with parsing table 560. The parsing table 560 is also associated with the result table 430.

Generally speaking the equipment command & communication table 500 permits the AMS controller 100 to send commands to, receive data from and otherwise communicate with various different types of test and communication equipment including the variety of test equipment 25 and the respective communication interface equipment (e.g. the communication server 55, Ethernet box 70, etc.). Each type of test and communication equipment may expect a different protocol, command, syntax, line rate, etc depending upon the equipment brand, model, release, etc. One of the key advantages of the inventive system is the ability to easily communicate with any such equipment and the database 400 facilitates such communication by providing the appropriate protocols, syntax, commands, etc for the particular type of equipment being utilized.

More specifically, the equipment table 520 may include the following information items or fields: equipment brand identifier, equipment brand name, equipment type identifier, equipment type description and other information items that are used to uniquely identify each piece of test and communication equipment.

The command table 540 may include various information items to map the specifically identified equipment to a specific command string that would be proper for that equipment. For example, the command table 540 may include an equipment command identifier, equipment brand identifier (ID), command ID, command string, and command string description. An important concept embodied by the command table 540 and its relationship to the equipment table 520 is that they permit the AMS controller 100 to correctly retrieve the appropriate command string for a specific type of equipment (e.g. test, communication or module under test). In this way, a generic command may be translated to an equipment-specific command.

Figure 13:
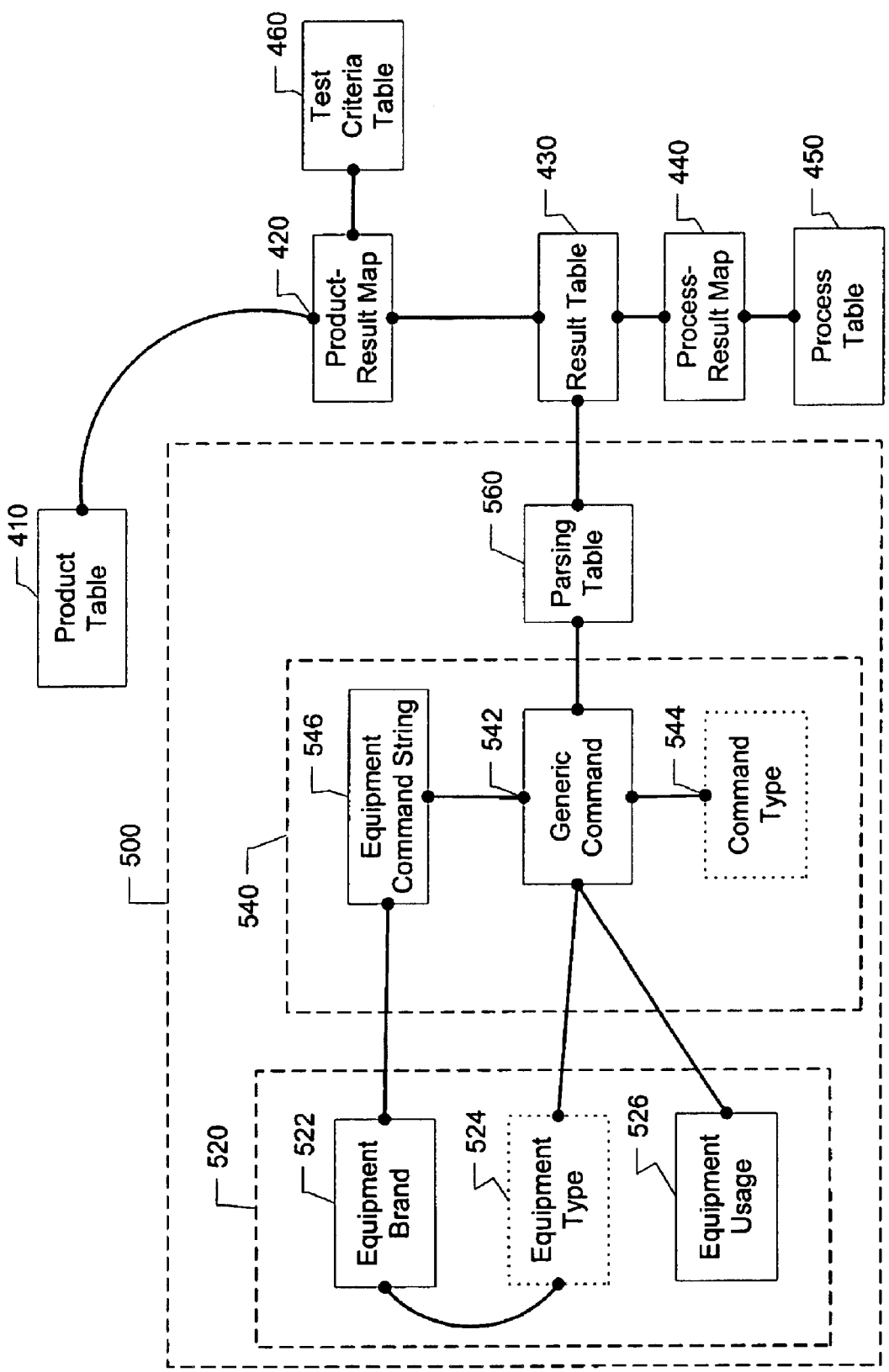
FIG. 13 is a mid-level data relationship diagram illustrating command table and test & equipment table details of the inventive database that may be used with the inventive systems and methods.

Even more specifically and as shown in FIG. 13, the equipment table 520 may include the following data entities: a equipment brand data entity 522, equipment type data entity 524 (optional particularly if the each brand has only one type), and the equipment usage data entity 526 each of which may include fields for ID, name and description (e.g. brand data entity 522 has an equipment brand ID which may be used as a key, equipment brand name and equipment brand description fields). Equipment brand entity 522 is associated with equipment type data entity 524 in order to positively identify the equipment. The usage data entity 526 keeps track of how much each piece of equipment is used and may also track which operator used the equipment, when, for how long, etc. Such usage information is quite helpful in, for example, knowing when a calibration or other service is due and to determine operator performance.

A significant item of the command table 540 is the generic command 542 data entity. Such a generic command data entity 542 (which may include command ID, command description, equipment type ID) permits the AMS controller 100 to simplify and streamline the commanding and controlling of a variety of equipment. By accessing the associated equipment table 520 via the equipment type ID, the AMS controller 100 can generate an equipment-specific command string from a generic command. Specifically, an equipment command string 546 is associated with the generic command 542 and to the equipment brand 522. A further mapping between the generic command 542 and command type 544 may also be used to provide an additional level of granularity to the command string sent to the equipment by the AMS controller 100. Thus, a generic script for conducting the stress testing processes that uses generic commands may be translated into equipment-specific command strings thereby greatly simplifying and streamlining the command process.

Table 500 may also be used to communicate with a variety of modules 15 under test. As mentioned above, some of the testing regimes may require sending commands to the modules 15 under test to, for example, place them in a particular mode or operational state. If a variety of modules 15 are being tested having different protocols, syntax, commands, etc then utilizing the table 500 would simplify sending commands to and receiving data from such modules 15.

As mentioned above, the invention also collects a variety of data from various equipment such as the test equipment 125. Such data may include the measurements made by the test equipment 125 and data from the module under test 15 itself. Like the commands, the data received may be in a variety of formats and may use a variety of syntax. In order to translate such data into a consistent format for storage and analysis the parsing table 560 is used. After parsing the equipment-specific formatted data according to the parsing table 560, the data may be stored in the result table 430.

Figure 14:
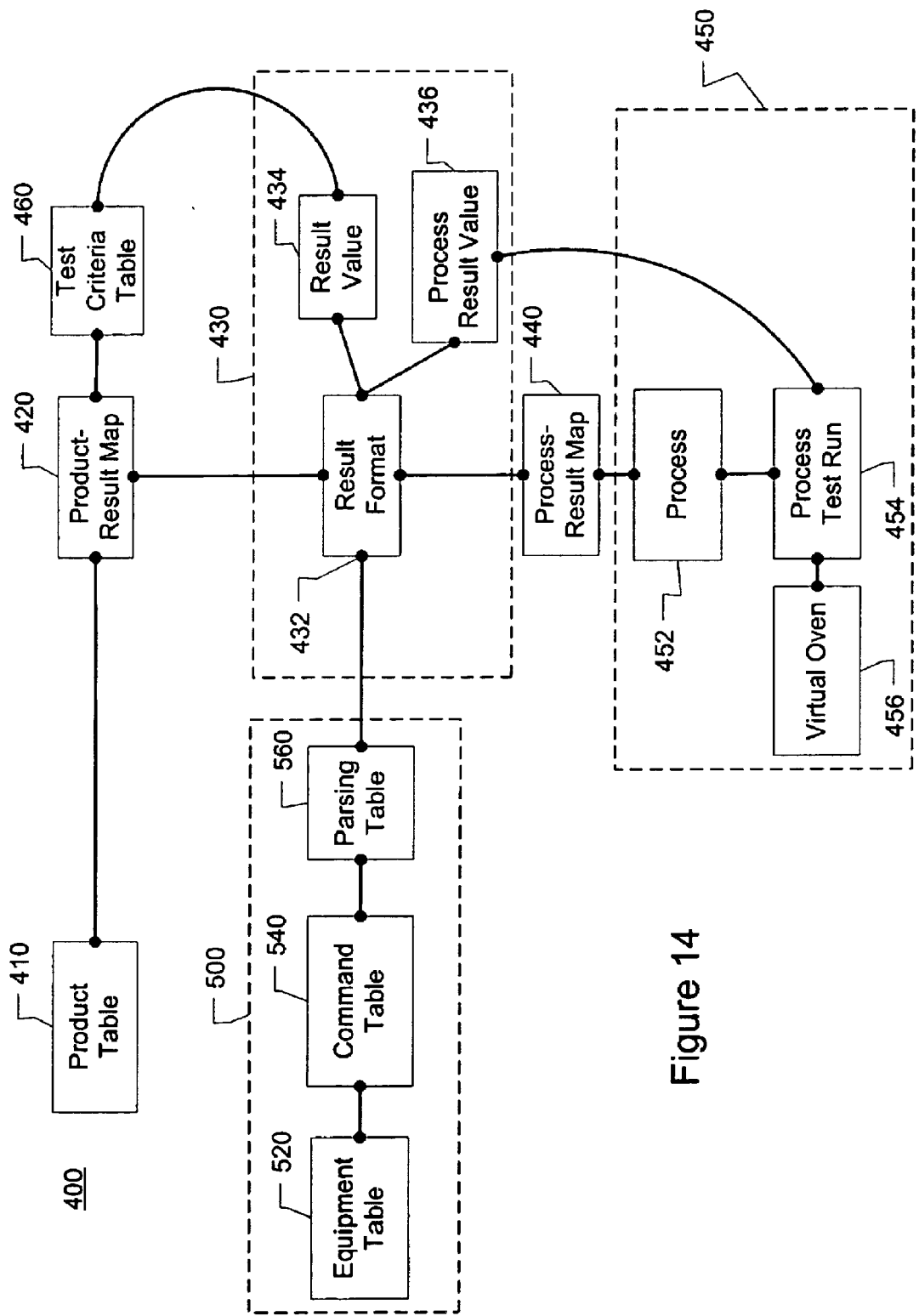
FIG. 14 is a mid-level data relationship diagram illustrating result table and process table details of the inventive database that may be used with the inventive systems and methods.

The result table 430 not only stores results but also associates those results to products via the product table 410 and processes via process table 450. As shown in FIG. 14, the result table 430 may include the following data entities: result format data entity 432, result value data entity 434 and process-result value data entity 436. The result format data entity 432 stores result formatting and processing information such as result ID, result description, max decimal digits, sort order, etc. The result value 434 stores the actual test result value, a pass/fail result, test run ID, and result ID. The process result value data entity 436 maps the results of the process to the actual stress test process that led to those results and includes information items such as the process test run ID and result ID.

The result value 434 is also associated with the test criteria table 460 which stores various limits, thresholds and other criteria that can be used to determine whether the result value should be considered a pass or fail condition. In other words, the AMS controller 100 may utilized the test criteria table 460 and result value 434 to determine pass/fail of an associated product for a particular test process.

The association between a particular test result and the test process used to test the product is generally handled by the data association between the result table 430 and the process table 450. The process-result map 440 serves as an intermediary map for handing the many-to-many relationship between the result table 430 and the process table 450 and may include both process ID and result ID keyed to similar information items in tables 430 and 450 for that purpose.

FIG. 14 also shows exemplary data entities within the process table 450 which include process data entity 452, process test run data entity 454 and virtual oven data entity 456. The process data entity 452 identifies the test process by, for example, ID, name, description, etc. The virtual oven data entity 456 identifies the virtual oven 10 by, for example, ID, description, location, etc. The process test run data entity 454 associates the virtual oven item 456 with the processes 452 that may be executed in the virtual oven 10 and the process result value 436.

Furthermore, the process test run data entity 454 is associated with the process result value data entity 436. In other words, the process test run data entity 454 keeps track of a particular iteration (run) of a process and thereby permits segregation of different runs of the same process. By associating the process test run data entity 454 to the process result value data entity 436, the system can keep track of which process result values relate to which iteration of the process.

Figure 15:
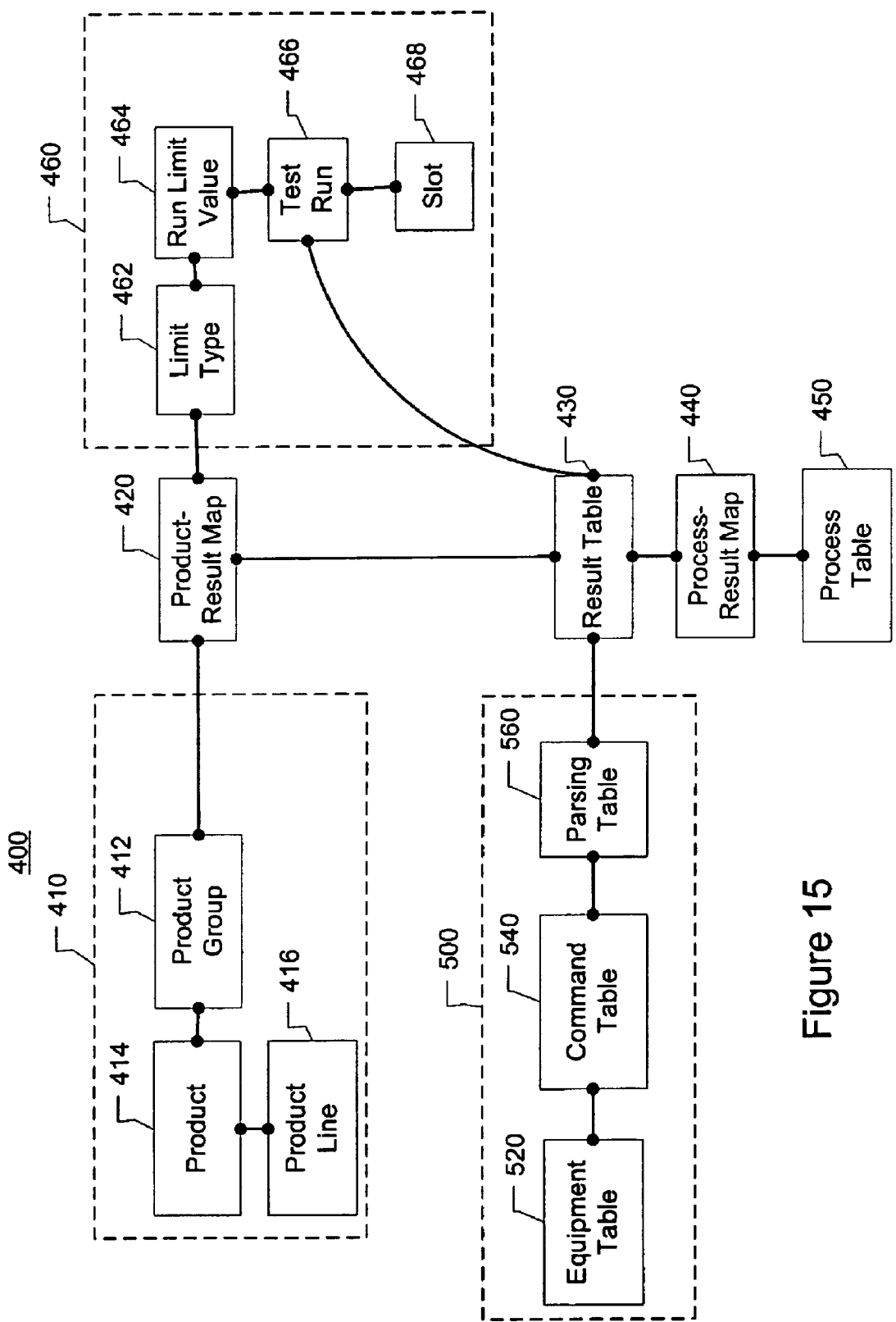
FIG. 15 is a mid-level data relationship diagram illustrating product table and test criteria table details of the inventive database that may be used with the inventive systems and methods.

As further detailed in FIG. 15, the test criteria table 460 may be expanded in order to handle different limit types, test runs and slots. More specifically, the test criteria table may include a limit type information item 462 (e.g. fixed limit range, percentage range, delta range), a run limit value information item 464 (e.g. storing actual limits against which the results are tested for pass/fail according to the type of limit), a test run information item 466 (to identify the test run process, the serial number of the product being tested, the slot ID (the module being tested may be plugged into a backplane that includes multiple slots for various PCB modules each of which may be subjected to one or more tests), and a slot information item (further specifying the equipment rack and shelf in which the slot is found as well as slot ID info). As further shown, a data association may also be created to link the test run 466 to the result table 430 in order to keep track of which test run a particular result belongs to.

FIG. 15 also illustrates information items that may be included within the product table 410. Namely, the product table 410 may include a product data entity 414 (e.g. including product ID, product name, product group ID, product description, product part number, product line, etc), a product line data entity (e.g. further specifying the product line information such as ID, name and description), and a product group information item 412 (e.g. further specifying details of the product group such as ID and description). As shown, the product line data entity 416 is associated with the product information data entity 414 which, in turn, is associated with the product group data entity 412. Moreover, a data association may also link the product group information data entity 412 and the result table data entity 430 via the product-result map 420.

An important aspect of the inventive database 400 is that it is a product oriented database. In other words, the data entities and their mutual data relationships revolve around the product being subjected to the stress test. In this way the stress test results may be associated with the various products, the test results may be mapped against product-specific test criteria, and generic commands may be translated to product-specific commands. Other functionalities enabled by the inventive database 400 include parsing incoming data from the different products and test equipment into a consistent and easily-usable format.

Another important aspect is the modularity of the virtual oven system and database. When a new product must be tested it is a relatively simply matter to update the database 40 and extend the system to be able to stress test such a new product. For example, the new product may be simply entered in the product data entity 414. Similarly, new test equipment may be added to the AMS system by updating the equipment table 520.

The invention being thus described, it will be obvious that the same may be varied in many ways. Such variations are not to be regarded as departure from the spirit and scope of the invention, and all such modifications as would be obvious to one skilled in the art are intended to be included within the scope of the following claims.

What is claimed is:

1. A stress-test information database stored in a computer-readable medium and usable for storing information related to a stress-test of different products, comprising:

a product data entity storing product-specific information for a plurality of the different products that may be subjected to the stress-test;

a process data entity storing testing process information for conducting one or more stress-test processes of the stress-test;

a result data entity storing stress-test result information relating to one or more results of the stress-test processes;

a product-result map relating said product data entity to said result data entity; and a process-result map relating said process data entity to said result data entity.

2. The stress-test information database according to claim 1, wherein a plurality of equipment may be utilized to conduct the stress-test, the database further comprising:

a command data entity storing command information that may be utilized to command the equipment; and an equipment data entity storing information relating to the equipment;

said equipment data entity being associated with said command data entity to permit a variety of equipment-specific command information to be retrieved.

3. The stress-test information database according to claim 2, said command data entity including a generic command data entity storing information relating to generic commands usable to conduct the stress test processes and an equipment command string data entity usable for translating generic commands to equipment-specific commands, said generic command data entity being associated with said equipment command string data entity; and said equipment data entity being associated with said command data entity, wherein a generic command may be translated into an equipment-specific command via the associations between said generic command data entity, said equipment command string data entity, and said equipment data entity.

4. The stress-test information database according to claim 3, wherein the equipment includes test equipment, equipment of the product being stress-tested, and/or communications equipment.

5. The stress-test information database according to claim 3, further comprising:

a parsing table storing information relating to parsing of equipment-specific data received as a result of the stress test;

said parsing table being associated with said equipment data entity to permit the equipment-specific data to be parsed into a more consistent format suitable for storage by said result data entity.

6. The stress-test information database according to claim 1, said product data entity including product group, product line and product identification data entities respectively storing information relating to groups of products, product lines within product groups, and specific product identification;

said product data entity being associated with said product group data entity and said product line data entity.

7. The stress-test information database according to claim 6, said product group data entity storing product group ID and group description information;

said product line data entity storing product line ID, product line name, and product line description information; and said product data entity storing product ID, product name, product group ID, product description, product part number and product line ID information.

8. The stress-test information database according to claim 1, wherein the stress test utilizes at least one virtual oven, said process data entity including:

a virtual oven data entity storing information relating to one or more virtual ovens that may be utilized to conduct the stress test.

9. The stress-test information database according to claim 1, wherein the stress test utilizes at least one virtual oven, said process data entity including:

a process information item storing information relating to stress test process identity and test process description;

a process test run data entity storing information relating to stress test process identity, virtual oven identity and stress test process start/stop time(s); and a virtual oven data entity storing information relating to virtual oven identity, virtual oven description and virtual oven location, said process test run data entity relating said virtual oven data entity to said process information item in order to permit functional associations between virtual ovens, stress test processes, and process-test runs.

10. The stress-test information database according to claim 9, said result data entity including:

a result format data entity storing information identifying and formatting stress-test result information relating to one or more stress-test processes;

a result value data entity storing stress-test result values; and a process-result data entity mapping stress-test result values to stress-test processes;

said result format data entity being associated with said result value data entity and said process-result data entity.

11. The stress-test information database according to claim 10, further comprising:

a test criteria data entity storing information relating to stress-test criteria, said test criteria data entity being associated with said result value data entity, said result value data entity item further including a pass/fail information item, said result value data entity and said test criteria data entity being usable to determine whether the product has passed or failed one or more of the stress-test processes.

12. The stress-test information database according to claim 11, said test criteria data entity including:

a limit type data entity storing information relating to fixed limit, percentage range and/or delta range test criteria limits;

a run limit value data entity storing information relating to run limit values; and a test run data entity storing information relating to a stress-test run identification information, said test run data entity being associated with said run limit value data entity and said result data entity to establish a functional relationship therebetween;

said limit type data entity being associated with said run limit value data entity and said product-result data entity to establish a functional relationship therebetween, wherein the association permit a result value for a particular test run and product to be compared against a corresponding run limit value.

13. A method of storing information related to a stress-test of different products in a computer-readable stress-test information database, comprising:

storing product-specific information for a plurality of the different products that may be subjected to the stress-test in a product data entity;

storing testing process information for conducting one or more stress-test processes of the stress-test in a process data entity;

storing stress-test result information relating to one or more results of the stress-test processes in a result data entity;

relating the product data entity to the result data entity with a product-result map; and relating the process data entity to the result data entity with a process-result map.

14. The method of storing information related to a stress-test of different products in a computer-readable stress-test information database according to claim 13, wherein a plurality of equipment is utilized to conduct the stress-test, the method further comprising:

storing command information that may be utilized to command the equipment in a command data entity; and storing information relating to the equipment in an equipment data entity;

associating the equipment data entity with the command data entity to permit a variety of equipment-specific command information to be retrieved.

15. The method of storing information related to a stress-test of different products in a computer-readable stress-test information database according to claim 14, said storing command information step including:
storing information relating to generic commands usable to conduct the stress test processes in a generic command data entity, and
storing equipment-specific commands in an equipment command string data entity;

associating the generic command data entity to the equipment command string data entity; and associating the equipment data entity with the command data entity, said storing steps permitting a generic command to be translated into an equipment-specific command via the associations between the generic command data entity, the equipment command string data entity, and the equipment data entity.

16. The method of storing information related to a stress-test of different products in a computer-readable stress-test information database according to claim 15, wherein the equipment includes test equipment, equipment of the product being stress-tested, and/or communications equipment.

17. The method of storing information related to a stress-test of different products in a computer-readable stress-test information database according to claim 15, further comprising:

storing information relating to parsing of equipment-specific data received as a result of the stress test in a parsing table;

said result data entity being associated with said parsing table to permit storage of parsed result information in the result data entity; and associating said parsing table with said equipment data entity to permit the equipment-specific data to be parsed into a more consistent format for storage by the result data entity.

18. The method of storing information related to a stress-test of different products in a computer-readable stress-test information database according to claim 13, further comprising:

respectively storing information relating to groups of products, product lines within product groups, and specific product identification in a product group data entity, a product line data entity, and a product identification data entity of the product data entity; and associating the product data entity with the product group data entity and the product line data entity.

19. The method of storing information related to a stress-test of different products in a computer-readable stress-test information database according to claim 18, further comprising:

storing product group ID and group description information in the product group data entity;

storing product line ID, product line name, and product line description information in the product line data entity; and storing product ID, product name, product group ID, product description, product part number and product line ID information in the product data entity.

20. The method of storing information related to a stress-test of different products in a computer-readable stress-test information database according to claim 13, wherein the stress test utilizes at least one virtual oven, the method further comprising:

storing information relating to one or more virtual ovens that may be utilized to conduct the stress test in a virtual oven data entity of the process data entity.

21. The method of storing information related to a stress-test of different products in a computer-readable stress-test information database according to claim 13, wherein the stress test utilizes at least one virtual oven, said storing testing process information step including:
storing information relating to stress test process identity and test process description in a process information item of the process data entity,
storing information relating to stress test process identity, virtual oven identity and stress test process start/stop time(s) in a process test run data entity of the process data entity, and
storing information relating to virtual oven identity, virtual oven description and virtual oven location in a virtual oven data entity of the process data entity; and relating the virtual oven data entity to the process information item via the process test run data entity in order to permit functional associations between virtual ovens, stress test processes, and process-test runs.

22. The method of storing information related to a stress-test of different products in a computer-readable stress-test information database according to claim 21, said storing stress-test result information including:
storing information identifying and formatting stress-test result information relating to one or more stress-test processes in a result format data entity of the result data entity, and
storing stress-test result values in a result value data entity of the result data entity;

the method further comprising:
mapping stress-test result values to stress-test processes with a process-result data entity;
associating the result format data entity with the result value data entity and the process-result data entity.

23. The method of storing information related to a stress-test of different products in a computer-readable stress-test information database according to claim 22, further comprising:

including a pass/fail information item in the result value data entity;

storing information relating to stress-test criteria in a test criteria data entity; and associating the test criteria data entity with the result value data entity such that the result value data entity and the test criteria data entity are usable to determine whether the product has passed or failed one or more of the stress-test processes.

24. The method of storing information related to a stress-test of different products in a computer-readable stress-test information database according to claim 23, said storing test criteria data including:

storing information relating to fixed limit, percentage range and/or delta range test criteria limits in a limit type data entity of the test criteria data entity, storing information relating to run limit values in a run limit value data entity of the test criteria data entity, storing information relating to a stress-test run identification information in a test run data entity of the test criteria data entity, associating the test run data entity with the run limit value data entity and the result data entity to establish a functional relationship therebetween; and associating the limit type data entity with the run limit value data entity and the product-result data entity to establish a functional relationship therebetween;

said associating steps permitting a result value for a particular test run and product to be compared against a corresponding run limit value.

* * * * *